(12) United States Patent
Arai et al.

(10) Patent No.: US 10,896,942 B2
(45) Date of Patent: Jan. 19, 2021

(54) ORGANIC EL DISPLAY DEVICE AND METHOD FOR MANUFACTURING SAME

(71) Applicant: TORAY INDUSTRIES, INC., Tokyo (JP)

(72) Inventors: Takeshi Arai, Otsu (JP); Satoshi Kamemoto, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 180 days.

(21) Appl. No.: 15/546,153

(22) PCT Filed: Mar. 7, 2016

(86) PCT No.: PCT/JP2016/056992
§ 371 (c)(1),
(2) Date: Jul. 25, 2017

(87) PCT Pub. No.: WO2016/143740
PCT Pub. Date: Sep. 15, 2016

(65) Prior Publication Data
US 2018/0019290 A1 Jan. 18, 2018

(30) Foreign Application Priority Data

Mar. 11, 2015 (JP) .................. 2015-047955

(51) Int. Cl.
| | |
|---|---|
| *H01L 51/00* | (2006.01) |
| *H01L 27/32* | (2006.01) |
| *H01L 51/50* | (2006.01) |
| *H05B 33/10* | (2006.01) |
| *H05B 33/22* | (2006.01) |
| *C08G 73/10* | (2006.01) |

(Continued)

(52) U.S. Cl.
CPC .......... *H01L 27/3258* (2013.01); *C08G 73/10* (2013.01); *H01L 51/0035* (2013.01);
(Continued)

(58) Field of Classification Search
CPC . H01L 51/50; H01L 51/5253; H01L 51/0035; H01L 51/56; H01L 51/0034;
(Continued)

(56) References Cited

U.S. PATENT DOCUMENTS

| | | | | |
|---|---|---|---|---|
| 8,080,350 | B2 * | 12/2011 | Banba | ................... G03F 7/0233 |
| | | | | 430/14 |
| 8,895,676 | B2 * | 11/2014 | Miyoshi | ................. C08G 73/10 |
| | | | | 525/410 |

(Continued)

FOREIGN PATENT DOCUMENTS

| | | |
|---|---|---|
| CN | 101517492 A | 8/2009 |
| EP | 1 898 451 A1 | 3/2008 |

(Continued)

OTHER PUBLICATIONS

International Search Report, issued in PCT/JP2016/056992, PCT/ISA/210, dated May 31, 2016.

(Continued)

*Primary Examiner* — Sanza L. McClendon
(74) *Attorney, Agent, or Firm* — Birch, Stewart, Kolasch & Birch, LLP

(57) ABSTRACT

The purpose is to provide an organic EL display device which has good sensitivity and is free from the occurrence of luminance decrease or pixel shrinkage, thereby having excellent long-term reliability. In order to achieve the above-described purpose, provided is the following configuration. Namely, an organic EL display device wherein an insulating layer formed on a first electrode is a cured film obtained by curing a photosensitive resin composition; and the residual (Continued)

amount of acid anhydrides contained in the cured film is from 0.003 to 0.04 (inclusive) when the residual amount of aromatic rings contained in the cured film is taken as 1 (the reference value).

13 Claims, 3 Drawing Sheets

(51) Int. Cl.
  *H05B 33/12*   (2006.01)
  *H01L 51/52*   (2006.01)
  *H01L 51/56*   (2006.01)

(52) U.S. Cl.
  CPC .......... *H01L 51/50* (2013.01); *H01L 51/5253* (2013.01); *H01L 51/56* (2013.01); *H05B 33/10* (2013.01); *H05B 33/12* (2013.01); *H05B 33/22* (2013.01); *H01L 2227/323* (2013.01)

(58) Field of Classification Search
  CPC ............. H01L 51/0042; H01L 51/5237; H01L 27/3258; H05B 33/10; H05B 33/22; H05B 33/12; C08G 73/10
  See application file for complete search history.

(56) References Cited

U.S. PATENT DOCUMENTS

| | | | |
|---|---|---|---|
| 9,897,915 B2 * | 2/2018 | Komori | ................ C09D 179/08 |
| 2002/0162998 A1 | 11/2002 | Okuda et al. | |
| 2007/0001595 A1 | 1/2007 | Nakagawa | |

FOREIGN PATENT DOCUMENTS

| | | | | |
|---|---|---|---|---|
| JP | 11-158275 | A | 6/1999 | |
| JP | 2002-91343 | A | 3/2002 | |
| JP | 2007-12411 | A | 1/2007 | |
| JP | 2013-11784 | A | 1/2013 | |
| JP | 5348671 | B2 | 8/2013 | |
| JP | 2013-232314 | A | 11/2013 | |
| WO | WO-2015194892 | A1 * | 12/2015 | ................ C08J 5/00 |

OTHER PUBLICATIONS

Written Opinion of the International Searching Authority, issued in PCT/JP2016/056992, PCT/ISA/237, dated May 31, 2016.
Extended European Search Report dated Oct. 4, 2018, in European Patent Application No. 16761708.3.
Korean Office Action and English translation for Korean Application No. 10-2017-7024182, dated Aug. 27, 2020.

* cited by examiner

[Fig 1]
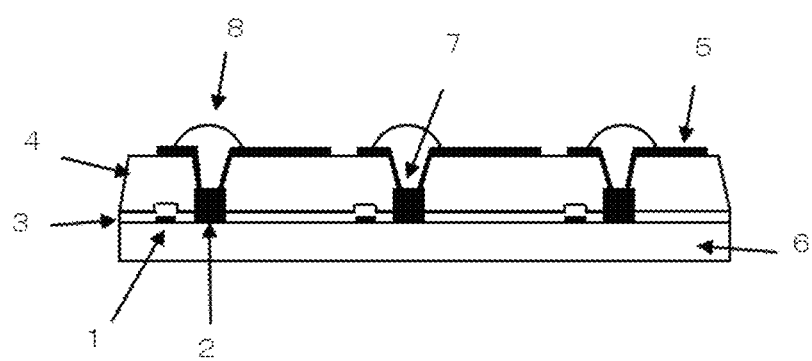

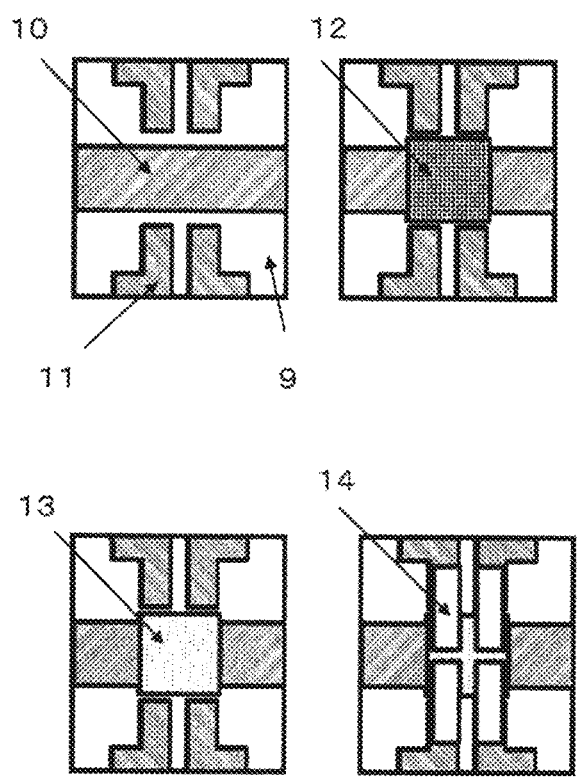
[Fig 2]

[Fig 3]
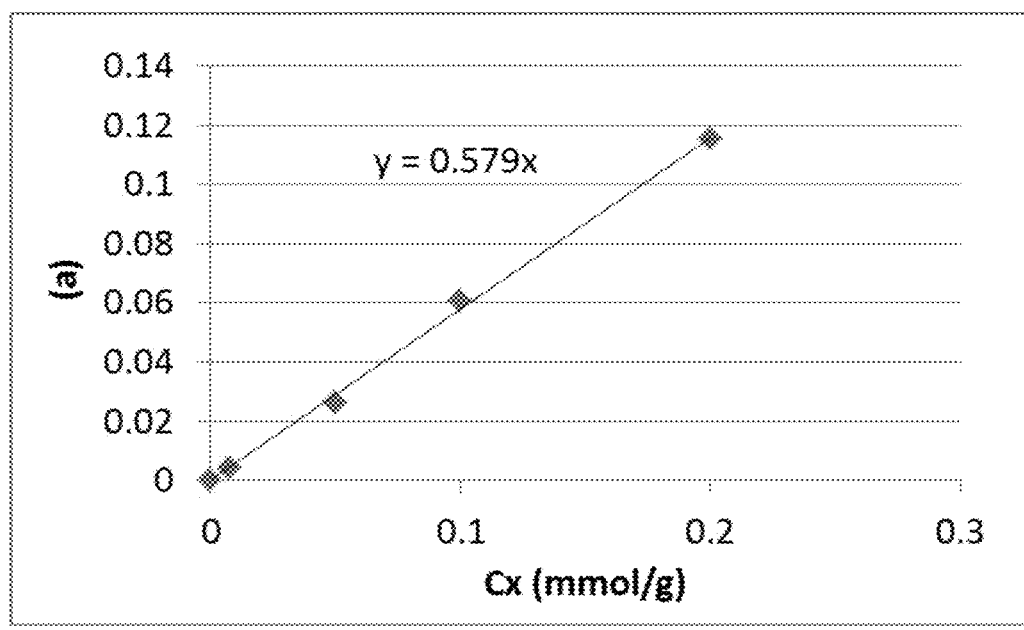

ORGANIC EL DISPLAY DEVICE AND METHOD FOR MANUFACTURING SAME

TECHNICAL FIELD

The present invention relates to: an organic EL display device which is provided with an insulating layer formed on a first electrode; and a method for manufacturing the organic EL display device.

BACKGROUND ART

Organic EL display devices have attracted attention as next-generation flat panel displays. An organic EL display device is a self-luminescent display device utilizing electroluminescence caused by an organic compound, enables the display of an image at a wide viewing angle, fast response and a high contrast, and has characteristic properties such that the reduction in thickness and weight. For these reasons, the research and development of organic EL display devices have been promoted in recent years.

On the other hand, one of the problems of organic EL display devices is long-term reliability. In general, an organic light-emitting material is sensitive to gaseous components and moisture, and can cause the decrease in luminance and pixel shrinkage. Pixel shrinkage is a phenomenon that the decrease in luminance occurs from edges of each pixel or lighting failure occurs. In order to improve the long-term reliability of a display element, it is essential to improve the durability of the organic light-emitting material, and it is also essential to improve the properties of materials used for the periphery of the display element, such as a planarization layer that covers a driving circuit and an insulating layer that is formed on a first electrode. In the planarization layer and the insulating layer, desired patterns can be formed easily using photosensitive resin compositions.

Particularly a positive-type photosensitivity resin composition is preferred, because the photosensitivity resin composition can be developed with an alkali and has excellent resolution properties. The conventionally proposed positive-type photosensitive resin compositions include one in which an o-quinone diazide compound (a photosensitive component) is mixed with an alkali-soluble resin and a polyimide precursor is used as a resin (see, for example, claims 1 to 4 in Patent Document 1) and one in which a polybenzoxazole precursor is used (see, for example, claims 1 to 4 in Patent Document 2).

In the case where it is intended to impart a light-blocking property to a photosensitive resin composition, a negative-type photosensitive composition is commonly used, because ultraviolet ray and so on can also be blocked during pattern exposure. As a photosensitive resin composition having a light-blocking property, a negative-type photosensitive resin composition containing a polyimide is known (see, for example, Patent Document 3). A negative-type photosensitivity resin composition using a cardo-type resin is also known (see, for example, Patent Document 4).

PRIOR ART DOCUMENTS

Patent Documents

Patent Document 1: Japanese Patent Laid-open Publication No. 2002-91343
Patent Document 2: Japanese Patent Laid-open Publication No. 2002-116715
Patent Document 3: International Publication No. 2013-111481
Patent Document 4: Japanese Patent Laid-open Publication No. 2015-069181

SUMMARY OF THE INVENTION

Problems to be Solved by the Invention

However, materials described in Patent Documents 1 to 4 may be insufficient with respect to long-term reliability, although they can be used for some period of time as insulating layers for dividing pixels in an organic EL display. In addition, even when the structure and composition of the resin are optimized for the purpose of improving long-term reliability, it is not practical from the viewpoint of productivity if good sensitivity cannot be achieved. In order to overcome the above-mentioned disadvantages, the present invention addresses the problem of providing an organic EL display device which has good sensitivity, does not undergo the decrease in luminance or pixel shrinkage, and has excellent long-term reliability.

Solutions to the Problems

One embodiment of the organic EL device according to the present invention is an organic EL display device in which an insulating layer formed on a first electrode comprises a cured film produced by curing a photosensitive resin composition, wherein the residual amount of acid anhydrides in the cured film is 0.003 to 0.04 inclusive when the residual amount of aromatic rings in the cured film is taken as 1 (the reference value).

Another embodiment of the organic EL device according to the present invention is an organic EL display device in which an insulating layer formed on a first electrode comprises a cured film produced by curing a photosensitive resin composition, wherein the below-shown index (a), which indicates the residual amount of acid anhydrides in the cured film, is 0.003 to 0.04 inclusive:

$$\text{index } (a) = (\text{intensity at } 1853 \text{ cm}^{-1})/(\text{intensity at } 1436 \text{ cm}^{-1})$$

(wherein each of the intensities represents an intensity of absorption measured with a Fourier transform infrared spectrometer (FT-IR).

Effects of the Invention

The organic EL display device according to the present invention has good sensitivity, does not undergo the decrease in luminance and pixel shrinkage, and has excellent long-term reliability.

BRIEF DESCRIPTION OF THE DRAWINGS

FIG. 1 shows a cross-sectional view of a TFT substrate.
FIG. 2 shows a schematic configuration of an organic EL display device.
FIG. 3 shows a graph illustrating a calibration curve for determining the concentration (Cx) of acid anhydrides from an index (a).

MODE FOR CARRYING OUT THE INVENTION

An embodiment of the present invention will be described in detail.

The organic EL display device according to the present invention is an active-matrix-type organic EL display device having multiple pixels formed on a matrix. In the active-matrix-type display device, TFTs (thin film transistors) and wiring lines that are respectively located on the sides of the TFTs are provided on a substrate (e.g., a glass substrate) and are respectively connected to the TFTs, a planarization layer is provided on the TFTs and the wiring lines so as to cover depressions and protrusions, and display elements are provided on the planarization layer. Each of the display elements and each of the wiring lines are connected to each other through a contact hole formed in the planarization layer.

In FIG. 1, a cross-sectional view of a TFT substrate having a planarization layer and insulating layers formed thereon is illustrated. Bottom-gate-type or top-gate-type TFTs 1 are provided in lines on a substrate 6, and a TFT insulating layer 3 is formed so as to cover the TFTs 1. Wiring lines 2 respectively connected to the TFTs 1 are provided beneath the TFT insulating layer 3. Contact holes 7 for opening the wiring lines 2 and a planarization layer 4 are provided on the TFT insulating layer 3, wherein the planarization layer 4 are provided in such a manner that the contact holes 7 are embedded in the planarization layer 4. Opening sections are provided in the planarization layer 4 so as to respectively reach the contact holes 7 for the wiring lines 2. ITOs 5 (transparent electrodes) are formed on the planarization layer 4 in such a manner that the ITOs 5 are respectively connected to the wiring lines 2 through the contact holes 7. The ITOs 5 serve as first electrodes for an organic EL element. Insulating layers 8 are respectively formed so as to cover the peripheries of the ITOs 5. The organic EL element may be of a top-emission-type (wherein emission light is emitted from the opposite side of the substrate 6) or of a bottom-emission type (wherein light is extracted from the substrate 6 side).

A display in which organic EL elements each having an emission peak wavelength in a red wavelength region, organic EL elements each having an emission peak wavelength in a green wavelength region and organic EL elements each having an emission peak wavelength in a blue wavelength region are arranged or a display in which white-color organic EL elements are formed on the whole surface thereof and is used in combination with a color filter is called "a color display", wherein it is common that the peak wavelength of displayed red region light is in the range from 560 to 700 nm, the peak wavelength of displayed green region light is in the range from 500 to 560 nm and the peak wavelength of displayed blue region light is in the range from 420 to 500 nm.

The area that is called "a luminescent pixel" is an area in which a first electrode and a second electrode, which are placed opposite to each other, intersect with each other and overlap with each other and, when an insulating layer is formed on the first electrode, an area which is defined by the insulating layer. In an active matrix-type display, an area in which a switching means is formed is arranged so as to occupy a part of the luminescent pixel, wherein the luminescent pixel may have a partially missing shape rather than a rectangular shape. However, the shape of the luminescent pixel is not limited to the above-mentioned shapes. The shape of the luminescent pixel may also be a circular shape, and may be altered readily depending on the shape of the insulating layer. In the present invention, the areal ratio of an opening section in an insulating layer to a unit area is called "an insulating layer opening ratio". The present invention can exhibit a greater effect by an organic EL display device having a smaller insulating layer opening ratio which aims to achieve highly precise display properties. This is because the problem of pixel shrinkage relies on the phenomenon that defects occur from edges of each pixel. More specifically, it is preferred in an organic EL device that the insulating layer opening ratio in a display area is 20% or less from the viewpoint of producing a greater effect of the present invention.

In the manufacture of the organic EL element in the present invention, an organic EL layer is first produced by a mask deposition method or an inkjet method. A typical mask deposition method is a method in which an organic compound is deposited using a deposition mask to form a pattern, wherein the deposition is carried out while placing a deposition mask having a desired patter as an opening section on the deposition source side of the substrate. In order to produce a high-precision deposition pattern, it is important to closely adhere a deposition mask having high flatness onto a substrate. In this case, a technique in which a tension is applied to the deposition mask, a technique in which a deposition mask is closely adhered onto a substrate with a magnet that is placed on the back surface of the substrate or the like is generally employed. Examples of the method for producing the deposition mask include an etching method, mechanical grinding, a sandblast method, a sintering method, a laser processing method, the utilization of a photosensitive resin and the like. In the case where a fine pattern is required, an etching method and an electrocasting method each capable of achieving excellent processing precision are commonly employed.

The configuration of the organic EL layer contained in the organic EL element in the present invention is not particularly limited, and may be any one of the following configurations: (1) a hole-transport layer/a light-emitting layer; (2) a hole-transport layer/a light-emitting layer/an electron transport layer; and (3) a light-emitting layer/an electron transport layer.

Subsequently, a second electrode is formed. In an active matrix type, the second electrode is often formed solidly over the whole area of the light-emitting area. The second electrode is required to have a function of a negative electrode, i.e., a function of injecting electrons efficiently. Therefore, a metallic material is usually used for the second electrode, from the viewpoint of the stability of the electrode. Alternatively, it is also possible to utilize the first electrode as a negative electrode and utilize the second electrode as a positive electrode.

After the formation of the second electrode, sealing is carried out to produce an organic EL display device. In general, an organic EL element is believed to be sensitive to moisture. Therefore, in order to produce a display device having high reliability, it is preferred to carry out the sealing under an atmosphere having smaller oxygen and moisture concentrations as possible. With respect to the member to be used for the sealing, it is preferred to select a member having a high gas barrier property.

An embodiment of the organic EL display device according to the present invention is an organic EL display device in which an insulating layer formed on a first electrode comprises a cured film produced by curing a photosensitive resin composition, wherein the residual amount of acid anhydrides in the cured film is 0.003 to 0.04 inclusive when the residual amount of aromatic rings in the cured film is taken as 1 (the reference value). In the present invention, a "cured film" is sometimes referred to as a "film" simply.

The present inventors have made intensive studies. As a result, it is found that the long-term reliability of an organic EL device can be improved by adjusting the amount of acid anhydrides contained in an insulating layer to a specific value or lower. More specifically, acid anhydrides contained in an insulating layer are deteriorated and are converted to carboxylic acids. Decomposed products of the carboxylic acids cause a chemical reaction with an electrode in the carboxylic acid, leading to so-called "pixel shrinkage" which is a phenomenon that the decrease in luminance from edge parts of pixels or lighting failure occurs. It is also found that, for the purpose of solving this problem, it is necessary to manage the amount of acid anhydrides in the cured film quantitatively and a measurement by FT-IR is suitable for the management. In a photosensitive resin composition, on the other hand, it is not desirable to adjust the amount of acid anhydrides in the insulating layer to zero from the viewpoint of the processing with high sensitivity. It is preferred that the residual amount of acid anhydrides in the cured film is 0.003 to 0.04 inclusive when the residual amount of aromatic rings in the cured film is taken as 1 (the reference value).

Another embodiment of the organic EL display device according to the present invention is an organic EL display device in which an insulating layer formed on a first electrode comprises a cured film produced by curing a photosensitive resin composition, wherein the below-shown index (a), which indicates the residual amount of acid anhydrides in the cured film, is 0.003 to 0.04 inclusive.

$$\text{Index }(a)=(\text{intensity at }1853\text{ cm}^{-1})/(\text{intensity at }1436\text{ cm}^{-1})$$

(wherein each of the intensities represents an intensity of absorption measured with a Fourier transform infrared spectrometer (FT-IR).

In order to produce an insulating layer having excellent long-term reliability and a low level of pixel shrinkage, it is important that the concentration of acid anhydrides in the cured film is small, namely, the intensity of absorption of acid anhydrides specified by the measurement by FT-IR of the cured film is reduced. More specifically, the index (a), which is expressed by the below-shown formula utilizing an intensity at a wavenumber of 1436 cm$^{-1}$ that corresponds to an aromatic ring and an intensity at a wavenumber of 1853 cm$^{-1}$ that corresponds to an acid anhydride, is preferably 0.04 or less, more preferably 0.03 or less. However, it is not desirable that the index (a) becomes zero, from the viewpoint of achieving a processing with high efficiency. The index (a) is preferably 0.003 or more.

$$\text{Index }(a)=(\text{intensity at }1853\text{ cm}^{-1})/(\text{intensity at }1436\text{ cm}^{-1})$$

In the formula, each of the intensities is an intensity of absorption which is measured by FT-IR.

The term "Fourier transform infrared spectrometer (FT-IR)" as used herein refers to a means of detecting the occurrence of chemical bonding or lattice vibration which is excited as the result of the absorption of infrared ray, and is suitable for the qualitative analysis of a functional group or the acquisition of information on the chemical structure of the functional group. The measurement mode, e.g., a transmission method and an ATR method (an attenuated total reflection method), can be selected depending on the positions of measurement or the form of a sample, and is not particularly limited.

The concentration Cx of acid anhydrides in a cured film that is produced from a photosensitive resin composition to be used in the present invention is preferably 0.0052 to 0.07 mmol/g inclusive.

It is preferred that the photosensitive resin composition to be used in the present invention comprises (A) an alkali-soluble resin having a carboxylic acid structure, (B) a photosensitizing agent and (C) an organic solvent.

<(A) Alkali-Soluble Resin Having Carboxylic Acid Structure>

The photosensitive resin composition to be used in the present invention preferably contains (A) an alkali-soluble resin having a carboxylic acid structure. The wording "having a carboxylic acid structure" as used herein refers to a fact of having a carboxyl group. When the alkali-soluble resin has a carboxylic acid structure, an effect of improving sensitivity can be achieved more easily. The term "alkali-soluble" as used herein refers to a matter that, when a solution prepared by dissolving the resin in γ-butyrolactone is applied on a silicon wafer, then the silicon wafer is prebaked at 120° C. for 4 minutes to form a prebaked film having a film thickness of 10 μm±0.5 μm, then the prebaked film is immersed in a 2.38-wt % aqueous tetramethylammonium hydroxide solution at 23±1° C. for 1 minute and then the immersed film is rinsed with pure water, a dissolution rate that is determined from the amount of decrease in film thickness is 50 nm/min. or more. The alkali-soluble resin having a carboxylic acid structure (A) is more preferably an alkali-soluble resin having an aromatic carboxylic acid structure, from the viewpoint of the improvement in heat resistance. The term "aromatic carboxylic acid structure" as used herein refers to a carboxylic acid structure that is bonded to an aromatic ring directly or through a covalent bond.

Examples of the resin that constitutes the main chain of the alkali-soluble resin having a carboxylic acid structure (A) include, but not limited to, a polyimide, a polyimide precursor, a polybenzoxazole, a polybenzoxazole precursor, a polyaminoamide, a polyamide, a cardo resin, a polymer produced from a radically polymerizable monomer and a phenolic resin. The term "an acid group" as used herein refers to a substituent that exhibits an acidic property in the Bronsted definition. Specific examples of the acidic group include a carboxyl group, a sulfonic acid group, a phosphoric acid group and a phenolic hydroxy group. As the resin in the alkali-soluble resin having a carboxylic acid structure (A), two or more of the above-mentioned resins may be contained. Among these resins, a resin which has excellent heat resistance and generates a reduced volume of an out-gas under high-temperature conditions is preferred. More specifically, a polyimide precursor is preferred, and a polyimide precursor having an amide acid structure is more preferred from the viewpoint of the improvement in solubility in an alkali.

In the present invention, it is preferred that, in the alkali-soluble resin having a carboxylic acid structure (A), a resin selected from a polyimide, a polyimide precursor and a polybenzoxazole precursor or a copolymer of the resin, which can be used as a resin constituting the main chain of the alkali-soluble resin having a carboxylic acid structure (A), has an acidic group in the constituent unit and/or the terminal of the main chain in the resin, in addition to a carboxylic acid structure, i.e., a carboxyl group, for the purpose of further improving alkali solubility of the alkali-soluble resin. Examples of the acidic group include a phenolic hydroxy group and a sulfonic acid group. Among these acidic groups, a phenolic hydroxy group is preferred, because no sulfur atom is contained in the group. It is also preferred that the alkali-soluble resin having a carboxylic acid structure (A) has a fluorine atom. In this case, it becomes possible to impart water repellency to an interface between the film and a base material during the development with an aqueous alkali solution, thereby easily preventing the penetration of the aqueous alkali solution into the interface. The fluorine atom content in the alkali-soluble resin having a carboxylic acid structure (A) is preferably 5% by weight or more from the viewpoint of the effect of preventing the penetration of the aqueous alkali solution into the interface, and is preferably 20% by weight or less from the viewpoint of the dissolution in the aqueous alkali solution.

In the present invention, it is preferred that the alkali-soluble resin having a carboxylic acid structure (A) has a structure represented by general formula (1).

[chemical formula 1]

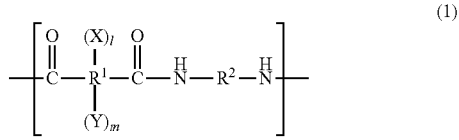

(1)

In general formula (1), $R^1$ represents a tetravalent organic group containing an aromatic ring; $R^2$ represents a bivalent organic group containing an aromatic ring; X represents a carboxylic acid which is covalently bonded to an aromatic ring; Y represents a carboxylic acid ester which is covalently bonded to an aromatic ring; and l represents an integer of 1 to 2 and m represents an integer of 0 to 1, wherein l+m is 2.

It is more preferred that the alkali-soluble resin having a carboxylic acid structure (A) has a structure represented by general formula (1) as the main repeating unit. More specifically, it is preferred that a structure represented by general formula (1) makes up 50 mol % or more of all of repeating units contained in the alkali-soluble resin having a carboxylic acid structure (A). In general formula (1), different types of $R^1$ groups and different types of $R^2$ groups may exist together in multiple repeating units.

In the resin having the structure represented by general formula (1) as the main repeating unit, which can be used in the photosensitive resin composition to be used in the present invention, it is preferred that at least one end of the molecule chain of the resin is capped with a monoamine or an acid anhydride. When an end-capping agent is used, it becomes possible to easily adjust the viscosity of the photosensitive resin composition containing the resultant resin to a proper value. It also becomes possible to achieve an effect of preventing the further hydrolysis of the resin with an acid end and to prevent the further deterioration of a quinone diazide compound that serves as a photosensitizing agent by an amine end when a positive-type photosensitivity resin composition is prepared using the resin.

The monoamine to be used as the end-capping agent is not particularly limited, is preferably a compound having a group represented by general formula (2).

[chemical formula 2]

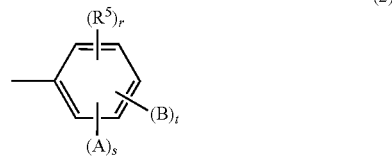

(2)

In general formula (2), $R^5$ represents a saturated hydrocarbon group having 1 to 6 carbon atoms; r represents 0 or 1; A and B may be the same as or different from each other, and independently represent a hydroxy group, a carboxyl group or a sulfonic acid group; and s and t independently represent 0 or 1, wherein s+t≥1 from the viewpoint of the solubility of the resultant resin in an aqueous alkali solution.

Preferred examples of the monoamine having a group represented by general formula (2) include 2-aminophenol, 3-aminophenol, 2-amino-m-cresol, 2-amino-p-cresol, 3-amino-o-cresol, 4-amino-o-cresol, 4-amino-m-cresol, 5-amino-o-cresol, 6-amino-m-cresol, 4-amino-2,3-xylenol, 4-amino-3,5-xylenol, 6-amino-2,4-xylenol, 2-amino-4-ethylphenol, 3-amino-4-ethylphenol, 2-amino-4-tert-butylphenol, 2-amino-4-phenylphenol, 4-amino-2,6-diphenylphenol, 4-aminosalicylic acid, 5-aminosalicylic acid, 6-aminosalicylic acid, 2-aminobenzoic acid, 3-aminobenzoic acid, 4-aminobenzoic acid, 2-amino-m-toluene acid, 3-amino-o-toluene acid, 3-amino-p-toluene acid, 4-amino-m-toluene acid, 6-amino-o-toluene acid, 6-amino-m-toluene acid, 3-aminobenzenesulfonic acid, 4-aminobenzenesulfonic acid and 4-aminotoluene-3-sulfonic acid. Two or more of these monoamines may be used in combination, or each of these monoamines may be used in combination with another end-capping agent.

The introduction ratio of the monoamine that can be used as an end-capping agent is preferably 10 to 100 moles, more preferably 40 to 80 moles, relative to 100 moles of the tetracarboxylic acid derivative that is a monomer component of the resin. When the introduction ratio is adjusted to 10 moles or more, preferably 40 moles or more, it becomes possible to improve the solubility of the resultant resin in an organic solvent and it also becomes possible to adjust the viscosity of the photosensitive resin composition prepared using the resultant resin to a proper value. From the viewpoint of the solubility of the resultant resin in an aqueous alkali solution and the mechanical strength of the cured film, the introduction ratio is preferably 100 moles or less, more preferably 80 moles or less, still more preferably 70 moles or less, relative to 100 moles of the tetracarboxylic acid derivative that is a monomer component of the resin.

The acid anhydride to be used as the end-capping agent is not particularly limited, and is preferably an acid anhydride having a cyclic structure or an acid anhydride having a crosslinkable group from the viewpoint of the heat resistance of the resultant resin. Specific examples of the acid anhydride include phthalic anhydride, maleic anhydride, nadic anhydride, cyclohexanedicarboxylic anhydride and 3-hydroxyphthalic anhydride.

The introduction ratio of the acid anhydride that can be used as the end-capping agent is preferably 10 to 100 moles, more preferably 50 to 100 moles, relative to 100 moles of the diamine that is a monomer component of the resin. When the introduction ratio is adjusted to 10 moles or more, preferably 50 moles or more, it becomes possible to improve the solubility of the resultant resin in an organic solvent and it also becomes possible to adjust the viscosity of the photosensitive resin composition prepared using the resultant resin properly. From the viewpoint of the solubility of the resultant resin in an aqueous alkali solution and the mechanical strength of the cured film, the introduction ratio is preferably 100 moles or less, more preferably 90 moles or less, relative to 100 moles of the diamine that is a monomer component of the resin.

The end-capping agent introduced in the resin can be detected easily by the following method. For example, the resin having the end-capping agent introduced thereinto is dissolved in an acidic solution to decompose the resin into an amine component and an acid component that are components of the resin, and the resultant product is subjected to gas chromatography (GC) or NMR measurement. In this manner, the end-capping agent can be detected easily. Alternatively, the end-capping agent can also be detected by directly subjecting the resin having the end-capping agent introduced thereinto to pyrolysis gas chromatography (PGC) or a measurement of infrared spectra or $^{13}C$ NMR spectra.

When the number of repetitions of the structure represented by general formula (1) in the resin having the structure represented by general formula (1) as the main repeating unit is taken as n, n is preferably 5 to 100, particularly preferably 10 to 70. If n is smaller than 5, the strength of the cured film prepared using the resultant resin may be deteriorated. If n is more than 100, on the other hand, the solubility of the resultant resin in an organic solvent may be deteriorated or the viscosity of the resin composition may become too high. The number of repetitions (n) in the present invention can be calculated easily by determining the weight average molecular weight (Mw) in terms of polystyrene by a gel permeation chromatography (GPC) measurement. When the molecular weight of the repeating unit is taken as M and the weight average molecular weight of the resin is taken as Mw, n=Mw/M. The weight average molecular weight (Mw) of the resin having the structure represented by general formula (1) as the main repeating unit is preferably 5,000 to 100,000, more preferably 10,000 to 50,000.

The resin having the structure represented by general formula (1) as the main repeating unit can be produced by a known polyamic acid or polyamic acid ester production method, and the method is not particularly limited. For example, a method in which a tetracarboxylic dianhydride is reacted with a diamine compound at a lower temperature and a method in which a diester is produced from a tetracarboxylic dianhydride and an alcohol and then the diester is reacted with a diamine compound in the presence of a condensing agent can be mentioned. It is also possible to replace a portion of a diamine compound and an acid dianhydride by the end-capping agent. In this case, a method in which the end-capping agent is added simultaneously with a diamine compound or a tetracarboxylic dianhydride, a method in which the end-capping agent is added after the reaction of a diamine compound with a tetracarboxylic dianhydride, and a method in which the end-capping agent is reacted with a tetracarboxylic dianhydride or a diamine compound and then the diamine compound or the tetracarboxylic dianhydride is added can be mentioned. A method in which the introduction rate of the end-capping agent relative to 100 moles of the diamine compound or the tetracarboxylic dianhydride to be reacted with the end-capping agent is more than 50 moles is preferred, because the production of an oligomer, e.g., a dimer and a trimer, can be prevented by adding a diamine compound or a tetracarboxylic dianhydride after the reaction of the end-capping agent with the tetracarboxylic dianhydride or the diamine compound. It is also desirable that a polymer produced by the above-mentioned method is isolated by introducing the polymer into a large volume of water, a methanol/water mixed solution or the like, then causing the polymer to precipitate, then filtrating the polymer and then drying the resultant filtrate. This precipitation procedure enables the removal of unreacted monomers or an oligomer component, e.g., a dimer and a trimer, thereby improving the film properties after heat curing.

Hereinbelow, as a preferred specific example of the method for producing the resin having the structure represented by general formula (1) as the main repeating unit, a method for producing a polyimide precursor will be described.

First, a tetracarboxylic dianhydride having an $R^1$ group is dissolved in a polymerization solvent, then a monoamine is added to the resultant solution, and then the resultant mixture is stirred with a mechanical stirrer. After the elapse of a predetermined time, a diamine compound having an $R^2$ group is added to the solution, and then the resultant mixture is further stirred for a predetermined time. The reaction temperature is preferably 0 to 100° C., more preferably 20 to 50° C., and the reaction time is preferably 0.5 to 50 hours, more preferably 2 to 24 hours.

The solvent to be used in the polymerization reaction may be any one, as long as the solvent can dissolve raw material monomers, i.e., an acid component and a diamine component, therein. The type of the solvent is not particularly limited, and is preferably a protic solvent. Specific examples of the solvent include: an amide such as N,N-dimethylformamide, N,N-dimethylacetamide and N-methyl-2-pyrrolidone; a cyclic ester such as γ-butyrolactone, γ-valerolactone, δ-valerolactone, γ-caprolactone, ε-caprolactone and α-methyl-γ-butyrolactone; a carbonate such as ethylene carbonate and propylene carbonate; a glycol such as propylene glycol monomethyl ether, diethylene glycol dimethyl ether, diethylene glycol diethyl ether, diethylene glycol ethyl methyl ether and triethylene glycol; a phenol such as m-cresol and p-cresol; acetophenone; 1,3-dimethyl-2-imidazolidinone; sulfolane; and dimethyl sulfoxide. The amount of the polymerization solvent to be used is preferably 100 to 1900 parts by weight, more preferably 150 to 950 parts by weight, relative to 100 parts by weight of the resultant resin.

<(B) Photosensitizing Agent>

As one embodiment of the photosensitizing agent (B) in the photosensitive resin composition to be used in the present invention, it is preferred that the photosensitizing agent (B) is (b1) an o-quinone diazide compound having positive-type photosensitivity.

The o-quinone diazide compound (b1) is preferably a compound in which a sulfonic acid moiety in a naphthoquinone diazide sulfonic acid is ester-bonded to a compound having a phenolic hydroxy group. A preferred example of the compound having a phenolic hydroxy group to be used is a compound in which 4-naphthoquinone diazide sulfonic acid or 5-naphthoquinone diazide sulfonic acid is introduced through an ester bond into a compound such as Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA and HML-TPHAP (product names, manufactured by Honshu Kagaku Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP and TM-BIP-A (product names, manufactured by Asahi Yukizai Corporation), 2,6-dimethoxymethyl-4-tert-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol and BisP-AP (a product name, manufactured by Honshu Kagaku Industry Co., Ltd.). A compound other than the above-mentioned compound may also be used.

A 4-naphthoquinone diazide sulfonyl ester compound has absorption thereof in an i-line region of a mercury lamp, and is therefore suitable for the exposure to i-line. A 5-naphthoquinone diazide sulfonyl ester compound has absorption thereof in a region extending to the g-line region of a mercury lamp, and is therefore suitable for exposure to g-line. In the present invention, both of a 4-naphthoquinone diazide sulfonyl ester compound and a 5-naphthoquinone diazide sulfonyl ester compound can be used preferably, and it is preferred to select either one of a 4-naphthoquinone diazide sulfonyl ester compound and a 5-naphthoquinone diazide sulfonyl ester compound depending on the wavelength to be employed for the exposure. A naphthoquinone diazide sulfonyl ester compound having both a 4-naphthoquinone diazide sulfonyl group and a 5-naphthoquinone diazide sulfonyl group in the molecule may be used, and a mixture of a 4-naphthoquinone diazide sulfonyl ester compound with a 5-naphthoquinone diazide sulfonyl ester compound may also be used.

The naphthoquinone diazide compound can be synthesized by an esterification reaction of a compound having a phenolic hydroxy group with a quinone diazide sulfonic acid compound, and the synthesis can be carried out by any known method. When the naphthoquinone diazide compound is used, the resolution, sensitivity and residual layer thickness of the resultant film can be further improved.

The amount of the component (b1) is preferably 4% by weight or more, more preferably 6% by weight or more, and is preferably 30% by weight or less, more preferably 20% by weight or less, relative to the whole weight of the positive-type photosensitive resin composition excluding the organic solvent (C). When the content is 4 to 30% by weight inclusive, a pattern can be formed easily with excellent sensitivity.

As another embodiment of the photosensitizing agent (B) in the photosensitive resin composition to be used in the present invention, it is preferred that the photosensitizing agent (B) is (b2) a photopolymerization initiator having negative-type photosensitivity, and it is also preferred that the photosensitive resin composition additionally contains (E) a radically polymerizable monomer.

The term "photopolymerization initiator (b2)" refers to a compound which can cause bond cleavage and/or a reaction upon exposure to light to generate radicals. When the photopolymerization initiator (b2) is contained, the radical polymerization of the below-mentioned radically polymerizable monomer (E) can proceed to cause the insolubilization of an exposed portion of the film of the resin composition in an alkaline developing solution, resulting in the formation of a negative-type pattern. In this case, the UV curing upon the exposure to light can be accelerated, resulting in the improvement in sensitivity.

The photopolymerization initiator (b2) is preferably a benzyl ketal photopolymerization initiator, an α-hydroxyketone-type photopolymerization initiator, an α-amino ketone-type photopolymerization initiator, an acylphosphine oxide-type photopolymerization initiator, an oxime ester-type photopolymerization initiator, an acridine-type photopolymerization initiator, a titanocene-type photopolymerization initiator, a benzophenone-type photopolymerization initiator, an acetophenone-type photopolymerization initiator, an aromatic keto ester-type photopolymerization initiator or a benzoic acid ester-type photopolymerization initiator, more preferably an α-hydroxyketone-type photopolymerization initiator, an α-amino ketone-type photopolymerization initiator, an acylphosphine oxide-type photopolymerization initiator, an oxime ester-type photopolymerization initiator, an acridine-type photopolymerization initiator or a benzophenone-type photopolymerization initiator from the viewpoint of the improvement in sensitivity upon exposure to light, still more preferably an α-amino ketone-type photopolymerization initiator, an acylphosphine oxide-type photopolymerization initiator or an oxime ester-type photopolymerization initiator.

A specific example of the benzyl ketal-type photopolymerization initiator is 2,2-dimethoxy-1,2-diphenylethan-1-one.

Specific examples of the α-hydroxyketone-type photopolymerization initiator include 1-(4-isopropylphenyl)-2-hydroxy-2-methylpropan-1-one, 2-hydroxy-2-methy-1-phenylpropan-1-one, 1-hydroxycyclohexyl phenyl ketone, 1-[4-(2-hydroxyethoxy)phenyl]-2-hydroxy-2-methylpropan-1-one and 2-hydroxy-1-[4-[4-(2-hydroxy-2-methylpropionyl)benzyl]phenyl]-2-methylpropan-1-one.

Specific examples of the α-amino ketone-type photopolymerization initiator include 2-methy-1-[4-(methylthio)phenyl]-2-morpholinopropan-1-one, 2-benzyl-2-dimethylamino-1-(4-morpholinophenyl)-butan-1-one, 2-dimethylamino-2-(4-methylbenzyl)-1-(4-morpholinophenyl)-butan-1-one and 3,6-bis(2-methyl-2-morpholinopropionyl)-9-octyl-9H-carbazole.

Specific examples of the acylphosphine oxide-type photopolymerization initiator include 2,4,6-trimethylbenzoyl-diphenylphosphine oxide, bis(2,4,6-trimethylbenzoyl)-phenylphosphine oxide and bis(2,6-dimethoxybenzoyl)-(2,4,4-trimethylpentyl)phosphine oxide.

Specific examples of the oxime ester-type photopolymerization initiator include 1-phenylpropane-1,2-dione-2-(O-ethoxycarbonyl)oxime, 1-phenylbutane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime 1-[4-[4-(carboxyphenyl)thio]phenyl]propane-1,2-dione-2-(O-acetyl)oxime, 1-[9-ethyl-6-(2-methylbenzoyl)-9H-carbazol-3-yl]ethanone-1-(O-acetyl)oxime, 1-[9-ethyl-6-[2-methyl-4-[1-(2,2-dimethy-1,3-dioxolan-4-yl) methyloxy]benzoyl]-9H-carbazol-3-yl]ethanone-1-(O-acetyl)oxime and "ADEKA ARKLES" (a registered trademark) NCI-831 (manufactured by ADEKA Corporation).

A specific example of the acridine-type photopolymerization initiator is
1,7-bis(acridin-9-yl)-n-heptane.

Specific examples of the titanocene-type photopolymerization initiator include
bis(η⁵-2,4-cyclopentadien-1-yl)-bis[2,6-difluoro)-3-(1H-pyrrol-1-yl)phenyl]titanium (IV) and
bis(η⁵-3-methyl-2,4-cyclopentadien-1-yl)-bis(2,6-difluorophenyl)titanium (IV).

Specific examples of the benzophenone-type photopolymerization initiator include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, an alkylated product of benzophenone, 3,3',4,4'-tetrakis(t-butylperoxycarbonyl)benzophenone, 4-methylbenzophenone, dibenzyl ketone and fluorenone.

Specific examples of the acetophenone-type photopolymerization initiator include 2,2-diethoxyacetophenone, 2,3-diethoxyacetophenone, 4-t-butyldichloroacetophenone, benzalacetophenone and 4-azidedbenzalacetophenone.

A specific example of the aromatic keto ester-type photopolymerization initiator is methyl 2-phenyl-2-oxyacetate.

Specific examples of the benzoic acid ester-type photopolymerization initiator include ethyl 4-dimethylaminobenzoate, (2-ethyl)hexyl 4-dimethylaminobenzoate, ethyl 4-diethylaminobenzoate and methyl 2-benzoylbenzoate.

The content of the photopolymerization initiator (b2) in the negative-type photosensitivity resin composition to be used in the present invention is preferably 0.1 part by weight or more, more preferably 0.5 part by weight or more, still more preferably 0.7 part by weight or more, particularly preferably 1 part by weight or more, relative to the total amount, i.e., 100 parts by weight, of the soluble resin composition having a carboxylic acid structure (A) and the below-mentioned radically polymerizable monomer (E). When the content falls within the above-mentioned range, sensitivity upon exposure to light can be improved. On the other hand, the content of the photopolymerization initiator (b2) is preferably 25 parts by weight or less, more preferably 20 parts by weight or less, still more preferably 17 parts by weight or less, particularly preferably 15 parts by weight or less. When the content falls within the above-mentioned range, the resolution after development can be improved and a low-tapered pattern form can be produced.

<(E) Radically Polymerizable Monomer>

The term "radically polymerizable monomer (E)" as used herein refers to a compound having at least two ethylenically unsaturated double bond groups in the molecule. Upon the exposure to light, the radical polymerization of the radically polymerizable monomer (E) can proceed by the action of radicals generated from the photopolymerization initiator (b2) to cause the insolubilization of an exposed portion of the film of the resin composition in an alkaline developing solution, resulting in the formation of a negative-type pattern. Furthermore, when the radically polymerizable monomer (E) is contained, the UV curing upon exposure to light can be accelerated to thereby improve sensitivity upon exposure to light. In addition, the crosslinking density after thermal curing can also be improved, resulting in the improvement in the hardness of the cured film.

The radically polymerizable monomer (E) is preferably a compound having a (meth)acrylic group, because the radical polymerization of the compound can proceed readily. From the viewpoint of the improvement in sensitivity upon exposure to light and the improvement in the hardness of the cured film, a compound having at least two (meth)acrylic groups in the molecule is more preferred. The double bond equivalent in the radically polymerizable monomer (E) is preferably 80 to 400 g/mol, from the viewpoint of the improvement in the sensitivity upon exposure to light and the improvement in the hardness of the cured film.

Specific examples of the radically polymerizable monomer (E) include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloyloxy-2-hydroxypropoxy)phenyl]propane, 1,3,5-tris((meth)acryloyloxyethyl)isocyanuric acid, 1,3-bis((meth)acryloyloxyethyl)isocyanuric acid, 9,9-bis[4-(2-(meth)acryloyloxyethoxy)phenyl]fluorene, 9,9-bis[4-(3-(meth)acryloyloxypropoxy)phenyl]fluorene and 9,9-bis(4-(meth)acryloyloxyphenyl)fluorene, and acid-modified products, ethylene oxide-modified products and propylene oxide-modified products thereof. From the viewpoint of the improvement in the sensitivity upon exposure to light and the improvement in the hardness of the cured film, trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloyloxy-2-hydroxypropoxy)phenyl]propane, 1,3,5-tris((meth)acryloyloxyethyl)isocyanuric acid, 1,3-bis((meth)acryloyloxyethyl)isocyanuric acid, 9,9-bis[4-(2-(meth)acryloyloxyethoxy)phenyl]fluorene, 9,9-bis[4-(3-(meth)acryloyloxypropoxy)phenyl]fluorene and 9,9-bis(4-(meth)acryloyloxyphenyl)fluorene, and acid-modified products, ethylene oxide-modified products and propylene oxide-modified products thereof are preferred. From the viewpoint of the improvement in resolution after development, the acid-modified products and the ethylene oxide-modified products are more preferred. From the viewpoint of the improvement in resolution after development, a compound which is produced by reacting a compound produced by the ring-opening addition reaction of a compound having at least two glycidoxy groups in the molecule with an unsaturated carboxylic acid having an ethylenically unsaturated double bond group, with a polybasic carboxylic acid or a polybasic carboxylic anhydride is also preferred.

The content of the radically polymerizable monomer (E) in the negative-type photosensitivity resin composition to be used in the present invention is preferably 15 parts by weight or more, more preferably 20 parts by weight or more, still more preferably 25 parts by weight or more, particularly preferably 30 parts by weight or more, relative to the total amount, i.e., 100 parts by weight, of the alkali-soluble resin having a carboxylic acid structure (A) and the radically polymerizable monomer (E). When the content falls within the above-mentioned range, the sensitivity upon exposure to light can be improved and a low-tapered pattern form can be produced. On the other hand, the content of the radically polymerizable monomer (E) is preferably 65 parts by weight or less, more preferably 60 parts by weight or less, still more preferably 55 parts by weight or less, particularly preferably 50 parts by weight or less. When the content falls within the above-mentioned range, the heat resistance of the cured film can be improved and a low-tapered pattern form can be produced.

<(C) Organic Solvent>

It is preferred that the photosensitive resin composition to be used in the present invention contains (C) an organic solvent. In this case, the photosensitive resin composition can be prepared in the form of a varnish and therefore the coatability of the photosensitive resin composition can be often improved.

Specific examples of the organic solvent (C) include: a polar aprotic solvent such as γ-butyrolactone; an ether such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran and dioxane; a ketone such as acetone, methyl ethyl ketone, diisobutyl ketone, cyclohexanone, 2-heptanone, 3-heptanone and diacetone alcohol; an ester such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate and ethyl lactate; another ester such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxy butyl acetate, 3-methyl-3-methoxy butyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate and ethyl 2-oxobutanoate; an aromatic hydrocarbon such as toluene and xylene; and an amide such as N-methylpyrrolidone, N,N-dimethylformamide and N,N-dimethylacetamide. These organic solvents may be used singly, or a mixture of two or more of them may be used.

The amount of the organic solvent (C) to be used may be adjusted appropriately depending on the types of the method for applying the photosensitive resin composition or the like, and is not particularly limited. For example, in the case where it is intended to prepare a positive-type, the amount is preferably 100 to 3000 parts by weight, more preferably 150 to 2000 parts by weight, relative to the whole weight of the positive-type photosensitive resin composition excluding the organic solvent (C). In the case where it is intended to apply a negative-type by spin coating to form a coating film, the content is generally 50 to 95% by weight relative to the whole weight of the photosensitive resin composition.

<(D) Thermally Cross-Linking Agent>

The photosensitive resin composition to be used in the present invention can contain (D) a thermally cross-linking agent. The term "thermally cross-linking agent" refers to a compound having at least two thermally reactive functional groups, including an alkoxymethyl group, a methylol group, an epoxy group and an oxetanyl group, in the molecule. The thermally cross-linking agent is preferably contained, because the thermally cross-linking agent can cross-link the component (A) and other additive components to improve the heat resistance, chemical resistance of hardness of the film after thermal curing, and can also reduce the volume of an out-gas generated from the cured film to improve the long-term reliability of the organic EL display device.

Preferred specific examples of the compound having at least two alkoxymethyl groups or methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA and HMOM-TPHAP (product names, manufactured by Honshu Kagaku Industry Co., Ltd.), and NIKALAC (a registered trademark) MX-290, NIKALAC MX-280, NIKALAC MX-270, NIKALAC MX-279, NIKALAC MW-100LM and NIKALAC MX-750LM (product names, manufactured by Sanwa Chemical Co., Ltd.).

Preferred examples of the compound having at least two epoxy groups include: Epolight 40E, Epolight 100E, Epolight 200E, Epolight 400E, Epolight 70P, Epolight 200P, Epolight 400P, Epolight 1500NP, Epolight 80MF, Epolight 4000 and Epolight 3002 (manufactured by Kyoeisha Chemical Co., Ltd.); Denacol (a registered trademark) EX-212L, Denacol EX-214L, Denacol EX-216L and Denacol EX-850L (manufactured by Nagase ChemteX Corporation); GAN and GOT (manufactured by Nippon Kayaku Co., Ltd.); Epikote (a registered trademark) 828, Epikote 1002, Epikote 1750, Epikote 1007, YX8100-BH30, E1256, E4250 and E4275 (manufactured by Japan Epoxy Resin Co., Ltd.); Epikuron (a registered trademark) EXA-9583 and HP4032 (manufactured by Dainippon Ink Chemical Corporation), VG3101 (manufactured by Mitsui Chemicals, Inc.), Tepic (a registered trademark) S, Tepic G and Tepic P (manufactured by Nissan Chemical Industries, Ltd.); Denacol EX-321L (manufactured by Nagase ChemteX Corporation); NC6000 (manufactured by Nippon Kayaku Co., Ltd.); Epotohto (a registered trademark) YH-434L (manufactured by Toto Kasei Co., Ltd.); EPPN502H and NC3000 (manufactured by Nippon Kayaku Co., Ltd.); and Epikuron N695 and HP7200 (manufactured by Dainippon Ink Chemical Corporation).

Preferred examples of the compound having at least two oxetanyl groups include: Eternacoll (a registered trademark) EHO, Eternacoll OXBP, Eternacoll OXTP and Eternacoll OXMA (manufactured by Ube Industries, Ltd.); and oxetanized phenol novolac.

Two or more of the thermally cross-linking agents may be used in combination.

The content of the thermally cross-linking agent is not particularly limited. In the case where it is intended to prepare a positive-type, the content is preferably 1 to 30% by weight inclusive relative to the whole weight of the positive-type photosensitive resin composition excluding the organic solvent (C). When the content of the thermally cross-linking agent is 1 to 30% by weight inclusive, the chemical resistance and hardness of the film after the burning or curing can be improved, the volume of an out-gas generated from the cured film can be reduced to improve the long-term reliability of the organic EL display device, and the storage stability of the positive-type photosensitive resin composition can become superior. On the other hand, the content of the thermally cross-linking agent in the negative-type photosensitivity resin composition is preferably 0.1 part by weight or more, more preferably 0.5 part by weight or more, still more preferably 1 part by weight or more, relative to the total weight, i.e., 100 parts by weight, of the alkali-soluble resin having a carboxylic acid structure (A) and the radically polymerizable compound (B). When the content falls within the above-mentioned range, the hardness and chemical resistance of the cured film can be improved. On the other hand, the content is preferably 70 parts by weight or less, more preferably 60 parts by weight or less, still more preferably 50 parts by weight or less. When the content falls within the above-mentioned range, the hardness and chemical resistance of the cured film can be improved.

<(F) Coloring Material>

The photosensitive resin composition to be used in the present invention preferably contains (F) a coloring material. The term "coloring material (F)" refers to a compound which can absorb light having a specific wavelength, particularly a compound which can color upon the absorption of light having a wavelength of visible light (380 to 780 nm). When the coloring material (F) is contained, a film produced from the photosensitive resin composition can be colored and, as a result, it becomes possible to impart a coloring property such that light passing through the film of the resin composition or light reflected from the film of the resin composition can be colored into a desired color can be imparted to the film. It also becomes possible to impart a light-blocking property such that light that can be absorbed by the coloring material (F) can be blocked from light that passes through the film of the resin composition or light that is reflected from the film of the resin composition.

An example of the coloring material (F) is a compound which can absorb light having a wavelength of visible light to color to a white, red, orange, yellow, green, blue or purple color. When two or more types of the coloring materials are used in combination, it becomes possible to improve a color-toning property, i.e., a property of toning the color of light that passes through the film of the resin composition or light that is reflected from the film of the resin composition to a color having a desired color coordinate.

In the photosensitive resin composition to be used in the present invention, it is preferred that the coloring material (F) comprises (F1) a pigment and/or (F2) a dye as mentioned below. In the photosensitive resin composition to be used in the present invention, it is preferred that the coloring material (F) comprises (Fa) a blackening agent and/or (Fb) a non-black coloring material. When the blackening agent (Fa) and the non-black coloring material (Fb) are contained, it becomes possible to impart a light-blocking property and a coloring property and/or a color-toning property to the film of the resin composition.

The term "blackening agent (Fa)" refers to a compound which can absorb light having a wavelength of visible light to color into a black color. When the blackening agent (Fa) is contained, the film of the resin composition is blackened and therefore a light-blocking property such that light passing through the film of the resin composition or light reflected from the film of the resin composition can be blocked can be improved. In this case, the resultant photosensitive resin composition can become suitable for a light-blocking film (e.g., a black matrix for a color spacer, a black color spacer for a liquid crystal display) and for a use application for which the increase in contrast by the inhibition of the reflection of external light is required. From the viewpoint of the light-blocking property, the blackening agent (Fa) is preferably a compound which can absorb light having any wavelength of visible light to color into a black color. A mixture of at least two types of the coloring materials (F) independently selected from a white coloring material, a red coloring material, an orange coloring material, a yellow coloring material, a green coloring material, a blue coloring material and a purple coloring material is also preferred. When at least two types of the coloring materials (F) are used in combination, it becomes possible to color into a black color artificially, resulting in the improvement in the light-blocking property. In the photosensitive resin composition to be used in the present invention, it is preferred that the blackening agent (Fa) comprises at least one component selected from dye mixtures each composed of at least two of (F1a) a black pigment and two black dyes (F2a-1) and (F2a-2) as mentioned below. From the viewpoint of the light-blocking property, it is preferred that the blackening agent (Fa) comprises (F1a) a black pigment as mentioned below.

The term "non-black coloring material (Fb)" refers to a compound which can color as the result of the absorption of light having a wavelength of visible light. Namely, the non-black coloring material (Fb) is a coloring material which can color into a non-black color, i.e., a white color, a red color, an orange color, a yellow color, a green color, a blue color or a purple color. In the photosensitive resin composition to be used in the present invention, it is preferred that the non-black coloring material (Fb) comprises (F1b) a non-black pigment and/or (F2b) a non-black dye. From the viewpoint of the light-blocking property and heat resistance or weather resistance, it is more preferred that the non-black coloring material (Fb) comprises (F1b) a non-black pigment as mentioned below.

In the photosensitive resin composition to be used in the present invention, the content ratio of the coloring material (F) is preferably 15% by weight or more, more preferably 20% by weight or more, still more preferably 25% by weight or more, particularly preferably 30% by weight or more, relative to the total weight, i.e., 100 parts by weight, of the alkali-soluble resin having a carboxylic acid structure (A), the coloring material (F) and a dispersant as mentioned below. When the content ratio falls within the above-mentioned range, the light-blocking property, the coloring property or the color-toning property can be improved. On the other hand, the content ratio of the coloring material (F) is preferably 80% by weight or less, more preferably 75% by weight or less, still more preferably 70% by weight or less, particularly preferably 65% by weight or less. When the content ratio falls within the above-mentioned range, the sensitivity upon exposure to light can be improved. The content ratio of the coloring material (F) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, the light-blocking property, the coloring property or the color-toning property can be improved. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F1) Pigment>

In the photosensitive resin composition to be used in the present invention, it is preferred that the coloring material (F) comprises (F1) a pigment. In an embodiment in which the coloring material (F) comprises the pigment (F1), it is preferred that the pigment (F1) is contained as the blackening agent (Fa) and/or the non-black coloring material (Fb). The term "pigment (F1)" refers to a compound which can color a material of interest through the physical absorption of the pigment (F1) onto the surface of the material of interest, the interaction between the surface of the material of interest with the pigment (F1) or the like, and the pigment (F1) is generally insoluble in a solvent or the like. When colored by the pigment (F1), the concealing property becomes high and therefor the discoloration by ultraviolet ray or the like rarely occurs. When the pigment (F1) is contained, it becomes possible to color into a color having an excellent concealing property and it also becomes possible to improve the light-blocking property and weather resistance of the film of the resin composition.

The number average particle diameter of the pigment (F1) is preferably 1 to 1,000 nm, more preferably 5 to 500 nm, still more preferably 10 to 200 nm. When the number average particle diameter of the pigment (F1) falls within the above-mentioned range, the light-blocking property of the film of the resin composition and the dispersion stability of the pigment (F1) can be improved. The number average particle diameter of the pigment (F1) can be determined by measuring the laser scattering caused by the Brownian motion of the pigment (F1) in a solution with a submicron particle size distribution measurement apparatus (N4-PLUS; manufactured by Beckman Coulter, Inc.) or a zeta potential-particle diameter-molecular weight measurement apparatus (Zetasizer Nano ZS; manufactured by Sysmex Corporation) (i.e., a dynamic light scattering method). The number average particle diameter of the pigment (F1) in a cured film produced from the resin composition can be determined by the measurement with a SEM and a TEM. The number average particle diameter of the pigment (F1) is determined directly with magnifications of 50,000× to 200,000×. In the case where the pigment (F1) is composed of truly spherical particles, the diameters of the truly spherical particles are measured and a number average particle diameter is determined. In the case where the pigment (F1) is not composed of truly spherical particles, the longest diameter (also referred to as a "major-axis diameter", hereinafter) and the longest dimeter as observed in a direction orthogonal to the major-axis diameter (also referred to as "a minor-axis diameter", hereinafter) are measured, and a two-axis average diameter obtained by taking the average of the major-axis diameter and the minor-axis diameter is taken as the number average particle diameter.

The pigment (F1) is, for example, an organic pigment or an inorganic pigment.

When an organic pigment is contained, it becomes possible to impart the coloring property or the color-toning property to the film of the resin composition. In addition, since the pigment is an organic substance, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property.

Examples of the organic pigment include a phthalocyanine-type pigment, an anthraquinone-type pigment, a quinacridone-type pigment, a pyranthrone-type pigment, a dioxazine-type pigment, a thioindigo-type pigment, a diketopyrrolopyrrole-type pigment, a quinophthalone-type pigment, a threne-type pigment, an indoline-type pigment, an isoindoline-type pigment, an isoindolinone-type pigment, a benzofuranone-type pigment, a perylene-type pigment, an aniline-type pigment, an azo-type pigment, an azomethine-type pigment, a condensed azo-type pigment, carbon black, a metal complex-type pigment, a lake pigment, a toner pigment and a fluorescent pigment. From the viewpoint of heat resistance, an anthraquinone-type pigment, a quinacridone-type pigment, a pyranthrone-type pigment, a diketopyrrolopyrrole-type pigment, a benzofuranone-type pigment, a perylene-type pigment, a condensed azo-type pigment and carbon black are preferred.

Examples of the phthalocyanine-type pigment include a copper phthalocyanine-type compound, a halogenated copper phthalocyanine-type compound and a metal-free phthalocyanine-type compound.

Examples of the anthraquinone-type pigment include an aminoanthraquinone-type compound, a diaminoanthraquinone-type compound, an anthrapyrimidine-type compound, a flavanthrone-type compound, an anthanthrone-type compound, an indanthrone-type compound, a pyranthrone-type compound and a violanthrone-type compound.

Examples of the azo-type pigment include a disazo-type compound and a polyazo-type compound.

When an inorganic pigment is contained, it becomes possible to impart the coloring property or the color-toning property to the film of the photosensitive resin composition. In addition, the pigment is an inorganic substance and therefore has excellent heat resistance and weather resistance, it becomes possible to improve the heat resistance and weather resistance of the film of the photosensitive resin composition.

Specific examples of the inorganic pigment include titanium oxide, barium carbonate, zirconium oxide, zinc flower, zinc sulfate, white lead, calcium carbonate, barium sulfate, white carbon, alumina white, silicon dioxide, kaolin clay, talc, bentonite, bengala, molybdenum red, molybdenum orange, chromium vermilion, chrome yellow, cadmium yellow, yellow iron oxide, titanium yellow, chromium oxide, viridian, titanium cobalt green, cobalt green, cobalt chromium green, victoria green, ultramarine blue, iron blue, cobalt blue, cerulean blue, cobalt silica blue, cobalt zinc silica blue, manganese violet, cobalt violet, graphite or a silver tin alloy; microparticles of a metal (e.g., titanium, copper, iron, manganese, cobalt, chromium, nickel, zinc, calcium, silver); and an oxide, a composite oxide, a sulfide, a sulfate salt, a nitrate salt, a carbonate salt, a nitride, a carbide and an oxynitride.

In the photosensitive resin composition to be used in the present invention, it is preferred that the pigment (F1) comprises (F1a) a black pigment as mentioned below or both of the black pigment (F1a) and (F1b) a non-black pigment as mentioned below.

The content ratio of the pigment (F1) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, the light-blocking property, the coloring property or the color-toning property can be improved. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F1a) Black Pigment and (F2a) Non-Black Pigment>

In the photosensitive resin composition to be used in the present invention, it is preferred that the pigment (F1) comprises (F1a) a black pigment or both of the black pigment (F1a) and (F1b) a non-black pigment. The term "black pigment (F1a)" refers to a pigment which can color into a black color as the result of the absorption of light having a wavelength of visible light. When the black pigment (F1a) is contained, the film of the resin composition can be blackened and the concealing property of the film can become superior, resulting in the improvement in the light-blocking property of the film of the resin composition. In the photosensitive resin composition to be used in the present invention, it is preferred that the black pigment (F1a) comprises at least one component selected from (F1a-1) a black organic pigment as mentioned below, (F1a-2) a black inorganic pigment as mentioned below and (F1a-3) a mixture of at least two coloring pigments.

The content ratio of the black pigment (F1a) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve a light-blocking property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

The term "non-black pigment (F1b)" refers to a pigment which can color into a non-black color, i.e., a purple, blue, green, yellow, orange, red or white color, as the result of the absorption of light having a wavelength of visible light. When the non-black pigment (F1b) is contained, the film of the resin composition can be colored to impart a coloring property or a color-toning property to the film. When at least two of the non-black pigments (F1b) are used in combination, the film of the resin composition can be colored into a color having a desired color coordinate and, therefore the color-toning property can be improved. An example of the non-black pigment (F1b) is a pigment which can color into a non-black color, i.e., a white, red, orange, yellow, green, blue or purple color, as mentioned below. In the negative-type photosensitivity resin composition to be used in the present invention, it is preferred that the non-black pigment (F1b) comprises (F1b-1) a non-black organic pigment and/or (F1b-2) a non-black inorganic pigment as mentioned below.

The content ratio of the non-black pigment (F1b) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the coloring property or the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F1a-1) Black Organic Pigment, (F1a-2) Black Inorganic Pigment, and (F1a-3) Mixture of at Least Two Types of Color Pigments>

In the negative-type photosensitivity resin composition to be used in the present invention, it is preferred that the black pigment (F1a) comprises at least one component selected from (F1a-1) a black organic pigment, (F1a-2) a black inorganic pigment and (F1a-3) a mixture of at least two coloring pigments. The term "black organic pigment (F1a-1)" refers to an organic pigment which can color into a black color as the result of the absorption of light having a wavelength of visible light. When the black organic pigment (F1a-1) is contained, the film of the resin composition can be blackened and, therefore, the concealing property can become superior, resulting in the improvement in the light-blocking property of the film of the resin composition. In addition, since the pigment is an organic substance, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property.

Examples of the black organic pigment (F1a-1) include an anthraquinone-type black pigment, a benzofuranone-type black pigment, a perylene-type black pigment, an aniline-type black pigment, an azomethine-type black pigment and carbon black. Specific examples of the carbon black include channel black, furnace black, thermal black, acetylene black and lamp black, and channel black is preferred from the viewpoint of a light-blocking property.

The content ratio of the black organic pigment (F1a-1) in solid materials in the negative-type photosensitivity resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the light-blocking property and the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<Surface-Treated Carbon Black>

The carbon black is preferably surface-treated carbon. The method for the surface treatment is preferably a surface treatment method in which an acidic group is introduced, a surface treatment method using a silane coupling agent or a coating method using a resin. When a surface treatment by introducing an acidic group or a surface treatment using a silane coupling agent is carried out, the state of the surfaces of carbon black particles can be modified (e.g., acidified, hydrophilized or hydrophobized) resulting in the improvement in dispersion stability of the resin contained in the resin composition by (G) a dispersant as mentioned below.

Examples of the acidic group which can be introduced by the surface treatment by introducing an acidic group include a carboxy group, a sulfonic acid group and a phosphoric acid group. The acidic group to be introduced into carbon black may form a salt. Examples of the cation that can form a salt in conjunction with the acidic group include various metal ions, cations of nitrogenated compounds, an arylammonium ion, an alkylammonium ion and an ammonium ion. From the viewpoint of the insulation property of the cured film, an arylammonium ion, an alkylammonium ion or an ammonium ion is preferred.

Examples of the surface treatment method for introducing an acidic group into carbon black include the following methods (1) to (5).

(1) A method for introducing a sulfonic acid group into carbon black by a direct substitution technique using concentrated sulfuric acid, fuming sulfuric acid or chlorosulfonic acid or an indirect substitution technique using a sulfite salt or a bisulfite salt; (2) a method in which an organic compound having an amino group and an acidic group is azotized and the azotized product is subjected to diazo coupling with carbon black; (3) a method in which an organic compound having a halogen atom and an acidic group is reacted with carbon black having a hydroxy group by a Williamson's etherification method; (4) a method in which an organic compound having a halogenated carbonyl group and an acidic group that is protected by a protecting group is reacted with carbon black having a hydroxy group; and (5) a method in which an organic compound having a halogenated carbonyl group and an acidic group that is protected by a protecting group is subjected to a Friedel-Crafts reaction with carbon black and the acidic group is then deprotected.

From the viewpoint of the easiness and safety of the acidic group introduction treatment, the method (2) is preferred. The organic compound having an amino group and an acidic group to be used in the method (2) is preferably an organic compound in which an amino group and an acidic group are bonded to an aromatic group. As the organic compound in which an amino group and an acidic group are bonded to an aromatic group, any known compound such as 4-aminobenzenesulfonic acid and 4-aminobenzoic acid can be used.

The molar number of the acidic group to be introduced into carbon black is preferably 1 mmol or more, more preferably 5 mmol or more, relative to 100 g of carbon black. When the molar number falls within the above-mentioned range, the dispersion stability of carbon black can be improved. On the other hand, the molar number is preferably 200 mmol or less, more preferably 150 mmol or less. When the molar number falls within the above-mentioned range, the dispersion stability of carbon black can be improved.

Examples of the substituent to be introduced into carbon black by means of a surface treatment with a silane coupling agent capable of modifying the state of the surfaces of the carbon black (wherein the silane coupling agent is also referred to as "a surface-treating organosilane", hereinafter) include an acidic group, a basic group, a hydrophilic group and a hydrophobic group. Specific examples of the acidic group, the basic group, the hydrophilic group and the hydrophobic group include an alkylsilyl group, an arylsilyl group, and an alkylsilyl group and an arylsilyl group each having a hydroxy group, a carboxy group or an amino group.

An example of the surface treatment method using the surface-treating organosilane is a method in which the surface-treating organosilane and carbon black are mixed. If necessary, a reaction solvent, water or a catalyst may be added.

Examples of the solvent to be used in the surface treatment with the surface-treating organosilane include those solvents which are same as the below-mentioned solvents. The amount of the reaction solvent to be added is preferably 10 to 1,000 parts by weight relative to the total weight, i.e., 100 parts by weight, of carbon black and the surface-treating organosilane. The amount of water to be added is preferably 0.5 to 2 mol relative to 1 mol of a hydrolyzable group.

The catalyst to be used in the surface treatment with the surface-treating organosilane is preferably an acid catalyst or a base catalyst. Specific examples of the acid catalyst include hydrochloric acid, nitric acid, sulfuric acid, hydrofluoric acid, phosphoric acid, acetic acid, trifluoroacetic acid, formic acid, a polycarboxylic acid and anhydrides of the aforementioned acids, and an ion exchange resin. Specific examples of the base catalyst include triethylamine, tri-n-propylamine, tri-n-butylamine, tri-n-pentylamine, tri-n-hexylamine, tri-n-heptylamine, tri-n-octylamine, diethylamine, triethanolamine, diethanolamine, sodium hydroxide, potassium hydroxide, an alkoxysilane having an amino group, and an ion exchange resin. The amount of the catalyst to be added is preferably 0.01 to 10 parts by weight relative to the total weight, i.e., 100 parts by weight, of carbon black and the surface-treating organosilane.

The temperature to be employed for the surface treatment with the surface-treating organosilane is preferably 20 to 250° C., more preferably 40 to 200° C., still more preferably 60 to 180° C.

As the surface-treating organosilane, any known compound may be used, such as methyltrimethoxysilane, methyltriethoxysilane, methyltri-n-butoxysilane, methyltrichlorosilane, methyltriacetoxysilane, ethyltrimethoxysilane, n-propyltrimethoxysilane, n-hexyltrimethoxysilane, n-decyltrimethoxysilane, phenyltrimethoxysilane, 4-hydroxyphenyltrimethoxysilane, 3-aminopropyltrimethoxysilane, 4-aminophenyltrimethoxysilane and 3-trimethoxysilylpropylsuccinic anhydride.

The content of the surface-treating organosilane is preferably 0.01% by weight or more, more preferably 0.05% by weight or more, relative to the total weight, i.e., 100 parts by weight, of carbon black and the surface-treating organosilane. When the content falls within the above-mentioned range, the dispersion stability of carbon black can be improved. On the other hand, the content is preferably 20% by weight or less, more preferably 15% by weight or less. When the content falls within the above-mentioned range, the dispersion stability of carbon black can be improved.

As the carbon black, resin-coated carbon black is also preferred. When the carbon black is coated with a resin capable of coating carbon black (wherein the resin is also referred to as "a coating resin", hereinafter), the surfaces of particles of the carbon black are coated with the coating resin, which has a poorly electrically conductive insulation property, to modify the state of the surfaces of the particles, and consequently the light-blocking property and the insulation property of the cured film can be improved. Furthermore, because the leakage current or the like is reduced, the reliability of the resultant display and the like can also be improved. For these reasons, the coating treatment is suitable, for example, in the case where the resin composition is used for applications in which the cured film is required to have an insulation property.

Specific examples of the coating resin include a polyamide, a polyamideimide, an epoxy resin, a novolac resin, a phenolic resin, a urea resin, a melamine resin, a polyurethane, a diallyl phthalate resin, an alkylbenzene resin, a polystyrene, a polycarbonate, a poly(butylene terephthalate) and a modified poly(phenylene oxide).

The content of the coating resin is preferably 0.1% by weight or more, more preferably 0.5% by weight or more, relative to the total weight, i.e., 100% by weight, of the carbon black and the coating resin. When the content falls within the above-mentioned range, the light-blocking property and the insulation property of the cured film can be improved. On the other hand, the content is preferably 40% by weight or less, more preferably 30% by weight or less. When the content falls within the above-mentioned range, the light-blocking property and the insulation property of the cured film can be improved.

The content ratio of the surface-treated carbon black in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the light-blocking property and the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

The term "black inorganic pigment (F1a-2)" refers to an inorganic pigment which can color into a black color as the result of the absorption of light having a wavelength of visible light. When the black inorganic pigment (F1a-2) is contained, the film of the resin composition can be blackened and, therefore, the concealing property can become superior, resulting in the improvement in the light-blocking property of the film of the resin composition. In addition, since the pigment is an inorganic substance and therefore has excellent heat resistance and weather resistance, it becomes possible to improve the heat resistance and weather resistance of the film of the resin composition.

Specific examples of the black inorganic pigment (F1a-2) include microparticles of graphite or a silver tin alloy, microparticles of a metal (e.g., titanium, copper, iron, manganese, cobalt, chromium, nickel, zinc, calcium, silver), an oxide, a composite oxide, a sulfide, a sulfate salt, a nitrate salt, a carbonate salt, a nitride, a carbide and an oxynitride. From the viewpoint of the improvement in the light-blocking property, microparticles of titanium or silver, an oxide, a composite oxide, a sulfide, a nitride, a carbide or an oxynitride is preferred, and a nitride or oxynitride of titanium is more preferred. Specific examples of the black organic pigment or the black inorganic pigment include Pigment Black 1, 6, 7, 12, 20, 31 and 32 (wherein each of the numerical values represents a color index (referred to as "C. I.", hereinafter) number).

The content ratio of the black inorganic pigment (F1a-2) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, the light-blocking property, the heat resistance and the weather resistance can be improved. On the other hand, the content ratio is preferably 70% by weight or less, more preferably 65% by weight or less, still more preferably 60% by weight or less. When the content ratio falls within the above-mentioned range, the sensitivity upon exposure to light can be improved.

The term "mixture of at least two types of color pigments (F1a-3)" refers to a pigment mixture which comprises a combination of at least two types of color pigments selected from white, red, orange, yellow, green, blue and purple pigments and can color into a black color artificially. When the mixture of at least two types of color pigments (F1a-3) is contained, the film of the resin composition can be blackened and, therefore, the concealing property can become superior, resulting in the improvement in the light-blocking property of the film of the resin composition. In addition, since at least two types of color pigments are mixed, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property.

Specific examples of the pigment capable of coloring into a red color include Pigment Red 9, 48, 97, 122, 123, 144, 149, 166, 168, 177, 179, 180, 192, 209, 215, 216, 217, 220, 223, 224, 226, 227, 228, 240 and 250 (wherein each of the numerical values represents a C. I. number).

Specific examples of the pigment capable of coloring into an orange color include Pigment Orange 12, 36, 38, 43, 51, 55, 59, 61, 64, 65 and 71 (wherein each of the numerical values represents a C. I. number).

Specific examples of the pigment capable of coloring into a yellow color include Pigment Yellow 12, 13, 17, 20, 24, 83, 86, 93, 95, 109, 110, 117, 125, 129, 137, 138, 139, 147, 148, 150, 153, 154, 166, 168 and 185 (wherein each of the numerical values represents a C. I. number).

Specific examples of the pigment capable of coloring into a green color include Pigment Green 7, 10, 36 and 58 (wherein each of the numerical values represents a C. I. number).

Specific examples of the pigment capable of coloring into a blue color include Pigment Blue 15, 15:3, 15:4, 15:6, 22, 60 and 64 (wherein each of the numerical values represents a C. I. number).

Specific examples of the pigment capable of coloring into a purple color include Pigment Violet 19, 23, 29, 30, 32, 37, 40 and 50 (wherein each of the numerical values represents a C. I. number).

Specific examples of the pigment capable of coloring into a white color include titanium oxide, barium carbonate, zirconium oxide, zinc flower, zinc sulfate, white lead, calcium carbonate, barium sulfate, white carbon, alumina white, silicon dioxide, kaolin clay, talc and bentonite.

The content ratio of the mixture of at least two types of color pigments (F1a-3) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the light-blocking property and the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F1b-1) Non-Black Organic Pigment, (F1b-2) Non-Black Inorganic Pigment>

In the photosensitive resin composition to be used in the present invention, it is preferred that the non-black pigment (F1b) comprises (F1b-1) a non-black organic pigment and/or (F1b-2) a non-black inorganic pigment. The term "non-black organic pigment (F1b-1)" refers to an organic pigment which can color into a non-black color, i.e., a white, red, orange, yellow, green, blue or purple color, as the result of the absorption of light having a wavelength of visible light. When the non-black organic pigment (F1b-1) is contained, it becomes possible to color the film of the resin composition and it also becomes possible to impart a coloring property or a color-toning property. In addition, since the pigment is an organic substance, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property. When at least two types of the non-black organic pigments (F1b-1) are used in combination, the film of the resin composition can be colored into a color having a desired color coordinate and the color-toning property can be improved.

An example of the non-black organic pigment (F1b-1) is an organic pigment which can color into a non-black color, i.e., a white, red, orange, yellow, green, blue or purple color. Specific examples of the non-black organic pigment (F1b-1) include a phthalocyanine-type pigment, an anthraquinone-type pigment, a quinacridone-type pigment, a pyranthrone-type pigment, a dioxazine-type pigment, a thioindigo-type pigment, a diketopyrrolopyrrole-type pigment, a quinophthalone-type pigment, a threne-type pigment, an indoline-type pigment, an isoindoline-type pigment, an isoindolinone-type pigment, a benzofuranone-type pigment, a perylene-type pigment, an aniline-type pigment, an azo-type pigment, an azomethine-type pigment, a metal complex-type pigment, a lake pigment, a toner pigment and a fluorescent pigment.

The content ratio of the non-black organic pigment (F1b-1) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, the coloring property and the color-toning property can be improved. On the other hand, the content ratio is preferably 70% by weight or less, more preferably 65% by weight or less, still more preferably 60% by weight or less. When the content ratio falls within the above-mentioned range, the sensitivity upon exposure to light can be improved.

The term "non-black inorganic pigment (F1b-2)" refers to an inorganic pigment which can color into a non-black color, i.e., a white, red, orange, yellow, green, blue or purple color, as the result of the absorption of light having a wavelength of visible light. When the non-black inorganic pigment (F1b-2) is contained, it becomes possible to color the film of the resin composition to impart a coloring property or a color-toning property to the film. In addition, since the pigment is an inorganic substance and therefore has excellent heat resistance and weather resistance, it becomes possible to improve the heat resistance and weather resistance of the film of the resin composition. When at least two types of the non-black inorganic pigments (F1b-2) are used in combination, the film of the resin composition can be colored into a color having a desired color coordinate and the color-toning property can be improved. When at least two types of the non-black inorganic pigments (F1b-2) are used in combination, the color of the film of the resin composition can be colored into a color having a desired color coordinate and the color-toning property can be improved.

An example of the non-black inorganic pigment (F1b-2) is an inorganic pigment which can color into a non-black color, i.e., a white, red, orange, yellow, green, blue or purple color.

Specific examples of the non-black inorganic pigment (F1b-2) include titanium oxide, barium carbonate, zirconium oxide, zinc flower, zinc sulfate, white lead, calcium carbonate, barium sulfate, white carbon, alumina white, silicon dioxide, kaolin clay, talc, bentonite, bengala, molybdenum red, molybdenum orange, chromium vermilion, chrome yellow, cadmium yellow, yellow iron oxide, titanium yellow, chromium oxide, viridian, titanium cobalt green, cobalt green, cobalt chromium green, victoria green, ultramarine blue, iron blue, cobalt blue, cerulean blue, cobalt silica blue, cobalt zinc silica blue, manganese violet and cobalt violet.

The content ratio of the non-black inorganic pigment (F1b-2) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the coloring property or the color-toning property, heat resistance and weather resistance. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F1a-1a) Benzofuranone-Type Black Pigment and (F1a-1b) Perylene-Type Black Pigment>

In the photosensitive resin composition to be used in the present invention, it is preferred that the black organic pigment (F1a-1) comprises (F1a-1a) a benzofuranone-type black pigment and/or (F1a-1b) a perylene-type black pigment. The term "benzofuranone-type black pigment (F1a-1a)" refers to a compound which has a benzofuran-2(3H)-one structure or a benzofuran-3(2H)-one structure in the molecule and can color into a black color as the result of the absorption of light having a wavelength of visible light. When the benzofuranone-type black pigment (F1a-1a) is contained, the film of the resin composition can be blackened and, therefore, the concealing property can become superior, resulting in the improvement in the light-blocking property of the film of the resin composition. In addition, since the pigment is an organic substance, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property. Particularly, since the pigment can improve the transmittance of a wavelength in a near infrared region (e.g., 700 nm or longer), the pigment is suitable in applications for which a light-blocking property is required and in which light having a wavelength in a near infrared region is utilized.

The benzofuranone-type black pigment (F1a-1a) is preferably a benzofuranone compound represented by any one of general formulae (63) to (65).

[chemical formula 3]

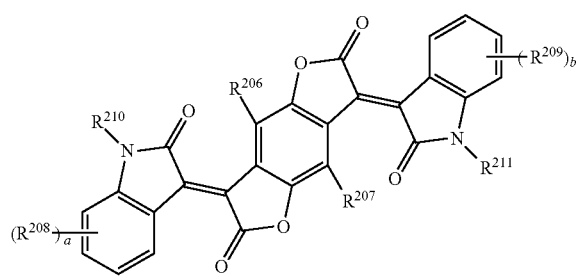

(63)

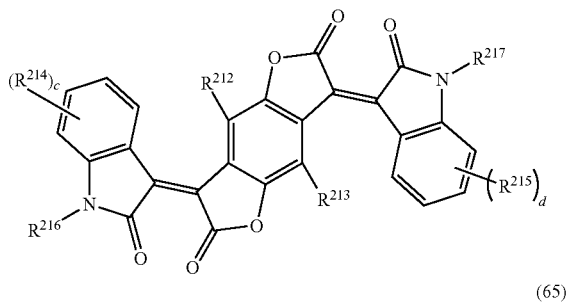

(64)

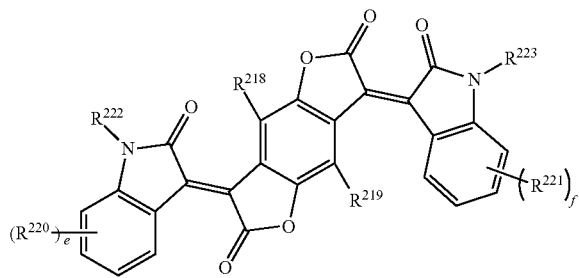

(65)

In general formulae (63) to (65), $R^{206}$, $R^{207}$, $R^{212}$, $R^{213}$, $R^{218}$ and $R^{219}$ independently represent a hydrogen atom, a halogen atom, an alkyl group having 1 to 10 carbon atoms or an alkyl group having 1 to 10 carbon atoms and also having 1 to 20 fluorine atoms; $R^{208}$, $R^{209}$, $R^{214}$, $R^{215}$, $R^{220}$ and $R^{221}$ independently represent a hydrogen atom, a halogen atom, an alkyl group having 1 to 10 carbon atoms, a carboxy group, a sulfonic acid group, an amino group or a nitro group; and $R^{210}$, $R^{211}$, $R^{216}$, $R^{217}$, $R^{222}$ and $R^{223}$ independently represent a hydrogen atom, an alkyl group having 1 to 10 carbon atoms or an aryl group having 6 to 15 carbon atoms. In general formulae (63) to (65), $R^{206}$, $R^{207}$, $R^{212}$, $R^{213}$, $R^{218}$ and $R^{219}$ preferably independently represent a hydrogen atom, a halogen atom, an alkyl group having 1 to 6 carbon atoms or an alkyl group having 1 to 6 carbon atoms and also having 1 to 12 fluorine atoms; $R^{208}$, $R^{209}$, $R^{214}$, $R^{215}$, $R^{220}$ and $R^{221}$ preferably independently represent a hydrogen atom, a halogen atom, an alkyl group having 1 to 6 carbon atoms, a carboxy group or a sulfonic acid group; and $R^{210}$, $R^{211}$, $R^{216}$, $R^{217}$, $R^{222}$ and $R^{223}$ preferably independently represent a hydrogen atom, an alkyl group having 1 to 6 carbon atoms or an aryl group having 6 to 10 carbon atoms. Each of the alkyl group, the aryl group and the amino group may be in an unsubstituted form or a substituted form.

Specific examples of the benzofuranone-type black pigment (F1a-1a) include "IRGAPHOR" (a registered trademark) BLACK S0100CF (manufactured by BASF), a black pigment mentioned in International Application No. 2010-081624 and a carbon pigment mentioned in International Application No. 2010-081756.

The content ratio of the benzofuranone-type black pigment (F1a-1a) in the negative-type photosensitivity resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the light-blocking property and the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

The term "perylene-type black pigment (F1a-1b)" refers to a compound which has a perylene structure in the molecule and can color into a black color as the result of the absorption of light having a wavelength of visible light.

When the perylene-type black pigment (F1a-1b) is contained, the film of the resin composition can be blackened and, therefore, the concealing property can become superior, resulting in the improvement in the light-blocking property of the film of the resin composition. In addition, since the pigment is an organic substance, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property. Particularly, since the pigment can improve the transmittance of a wavelength in a near infrared region (e.g., 700 nm or longer), the pigment is suitable in applications for which a light-blocking property is required and in which light having a wavelength in a near infrared region is utilized.

The perylene-type black pigment (F1a-1b) is preferably a perylene compound represented by general formula (66) or (67).

[chemical formula 4]

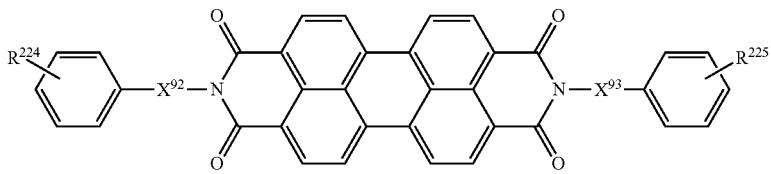

(66)

-continued

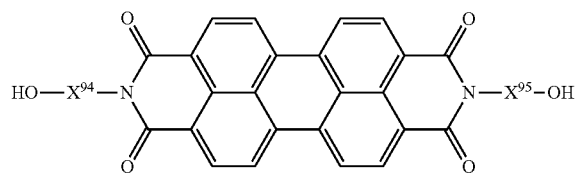

(67)

In general formulae (66) and (67), $X^{92}$, $X^{93}$, $X^{94}$ and $X^{95}$ independently represent an alkylene chain having 1 to 10 carbon atoms; $R^{224}$ and $R^{225}$ independently represent a hydrogen atom, a hydroxy group, an alkoxy group having 1 to 6 carbon atoms, or or an acyl group having 2 to 6 carbon atoms. In general formulae (66) and (67), $X^{92}$, $X^{93}$, $X^{94}$ and $X^{95}$ preferably independently represent an alkylene chain having 1 to 6 carbon atoms; $R^{224}$ and $R^{225}$ preferably independently represent a hydrogen atom, a hydroxy group, an alkoxy group having 1 to 4 carbon atoms, or an acyl group having 2 to 4 carbon atoms. Each of the alkylene chain, the alkoxy group and the acyl group may be in an unsubstituted form or a substituted form.

Specific examples of the perylene-type black pigment (F1a-1b) include Pigment Black 21, 30, 31, 32, 33 and 34 (wherein each of the numerical values represents a C. I. number).

In addition, specific examples of the perylene-type black pigment (F1a-1b) also include "PALIOGEN" (a registered trademark) BLACK S0084, K0084, L0086, K0086, EH0788 and FK4281 (manufactured by BASF).

The content ratio of the perylene-type black pigment (F1a-1b) in solid materials contained in the photosensitive resin composition to be used in the present invention excluding the organic solvent (C) is preferably 5% by weight or more, more preferably 10% by weight or more, still more preferably 15% by weight or more. When the content ratio falls within the above-mentioned range, it becomes possible to improve the light-blocking property and the color-toning property. On the other hand, the content ratio is preferably 70% by weight or less, more preferably 65% by weight or less, still more preferably 60% by weight or less. When the content ratio falls within the above-mentioned range, the sensitivity upon exposure to light can be improved.

<(F2) Dye>

In the photosensitive resin composition to be used in the present invention, it is preferred that the coloring material (F) comprises (F2) a dye. In an embodiment in which the coloring material (F) comprises the dye (F2), it is preferred that dye (F2) is contained as the blackening agent (Fa) and/or the non-black coloring material (Fb).

The term "dye (F2)" refers to a compound which can color a material of interest as the result of the chemical adsorption or a strong interaction of a substituent (e.g., an ionic group and a hydroxy group) in the dye (F2) onto or with the surface structure of the material of interest, and is generally soluble in a solvent and the like. In the coloration with the dye (F2), every molecule is adsorbed onto the material of interest, and therefore the coloring power is high and the color development efficiency is also high.

When the dye (F2) is contained, the coloring property and the color-toning property of the cured film of the photosensitive resin composition can be improved.

Examples of the dye (F2) include a direct dye, a reactive dye, a sulfur dye, a vat dye, a sulfur dye, an acidic dye, a metal-containing dye, a metal-containing acidic dye, a basic dye, a mordant dye, an acidic mordant dye, a disperse dye, a cationic dye and a fluorescent whitening dye.

Specific examples of the dye (F2) include an anthraquinone-type dye, an azo-type dye, an azine-type dye, a phthalocyanine-type dye, a methine-type dye, an oxazine-type dye, a quinoline-type dye, an indigo-type dye, an indigoid-type dye, a carbonium-type dye, a threne-type dye, a perinone-type dye, a perylene-type dye, a triarylmethane-type dye and a xanthene-type dye. From the viewpoint of the solubility in the organic solvent (C) and heat resistance, an anthraquinone-type dye, an azo-type dye, an azine-type dye, a methine-type dye, a triarylmethane-type dye and a xanthene-type dye are preferred.

In the photosensitive resin composition to be used in the present invention, it is preferred that the dye (F2) comprises any one of (F2a-1) a black dye, (F2a-2) a dye mixture composed of at least two types of dyes and (F2b) a non-black dye as mentioned below.

The content ratio of the dye (F2) in solid materials contained in the photosensitive resin composition to be used in the present invention excluding the organic solvent (C) is preferably 0.01% by weight or more, more preferably 0.05% by weight or more, still more preferably 0.1% by weight or more. When the content ratio falls within the above-mentioned range, it becomes possible to improve the coloring property or the color-toning property. On the other hand, the content ratio is preferably 50% by weight or less, more preferably 45% by weight or less, still more preferably 40% by weight or less. When the content ratio falls within the above-mentioned range, the heat resistance of the cured film can be improved.

<(F2a-1) Black Dye, (F2a-2) Dye Mixture Composed of at Least Two Types of Dyes, and (F2b) Non-Black Dye>

In the photosensitive resin composition to be used in the present invention, it is preferred that the dye (F2) comprises any one of (F2a-1) a black dye, (F2a-2) a dye mixture composed of at least two types of dyes and (F2b) a non-black dye.

The term "black dye (F2a-1)" refers to a dye which can color into a black color as the result of the absorption of light having a wavelength of visible light.

When the black dye (F2a-1) is contained, the film of the resin composition can be blackened and therefore the coloring property becomes superior, resulting in the improvement in the light-blocking property of the film of the resin composition.

Specific examples of the black dye (F2a-1) include Solvent Black 3, 5, 7, 22, 27, 29 and 34, Mordant Black 1, 11 and 17, Acid Black 2 and 52, and Direct Black 19 and 154 (wherein each of the numerical values represents a C. I. number).

In addition, specific examples of the black dye (F2a-1) also include: "NUBIAN" (a registered trademark) BLACK TH-807, TH-827, TH-827K, TN-870, PC-0855, PC-5856, PC-5857, PC-5877, PC-8550, TN-873, TN-877 and AH-807; OIL BLACK HBB and 860; "VALIFAST" (a registered trademark) BLACK 1807, 3904, 3810, 3820, 3830, 3840, 3866 and 3870; and WATER BLACK 100-L, 191-L, 256-L, R-510 and 187-LM (manufactured by Orient Chemical Industries, Co., Ltd.).

The content ratio of the black dye (F2a-1) in solid materials contained in the photosensitive resin composition to be used in the present invention excluding the organic solvent (C) is preferably 0.01% by weight or more, more preferably 0.05% by weight or more, still more preferably 0.1% by weight or more. When the content ratio falls within the above-mentioned range, the light-blocking property can be improved. On the other hand, the content ratio is preferably 50% by weight or less, more preferably 45% by weight or less, still more preferably 40% by weight or less. When the content ratio falls within the above-mentioned range, the sensitivity upon exposure to light can be improved.

The term "dye mixture composed of at least two types of dyes (F2a-2)" refers to a dye mixture which is a combination of at least two dyes selected from a white dye, a red dye, an orange dye, a yellow dye, a green dye, a blue dye and a purple dye and can color into a black color artificially.

When the dye mixture composed of at least two types of dyes (F2a-2) is contained, the film of the resin composition can be blackened and the coloring property can become superior, resulting in the improvement in the light-blocking property of the film of the resin composition. In addition, since at least two types of dyes are mixed, it becomes possible to modulate the transmission spectra or absorption spectra of the film of the resin composition in such a manner that light having a desired specific wavelength can be transmitted or blocked by altering the chemical structure of the pigment or changing the functional group in the pigment, resulting in the improvement in the color-toning property.

Specific examples of the dye capable of coloring into a red color include: Direct Red 2, 4, 9, 23, 26, 28, 31, 39, 62, 63, 72, 75, 76, 79, 80, 81, 83, 84, 89, 92, 95, 111, 173, 184, 207, 211, 212, 214, 218, 221, 223, 224, 225, 226, 227, 232, 233, 240, 241, 242, 243 and 247; Acid Red 35, 42, 51, 52, 57, 62, 80, 82, 111, 114, 118, 119, 127, 128, 131, 143, 145, 151, 154, 157, 158, 211, 249, 254, 257, 261, 263, 266, 289, 299, 301, 305, 319, 336, 337, 361, 396 and 397; Reactive Red 3, 13, 17, 19, 21, 22, 23, 24, 29, 35, 37, 40, 41, 43, 45, 49 and 55; and Basic Red 12, 13, 14, 15, 18, 22, 23, 24, 25, 27, 29, 35, 36, 38, 39, 45 and 46 (wherein each of the numerical values represents a C. I. number).

Specific examples of the dye capable of coloring into an orange color include Basic Orange 21 and 23 (wherein each of the numerical values represents a C. I. number).

Specific examples of the dye capable of coloring into a yellow color include: Direct Yellow 8, 9, 11, 12, 27, 28, 29, 33, 35, 39, 41, 44, 50, 53, 58, 59, 68, 87, 93, 95, 96, 98, 100, 106, 108, 109, 110, 130, 142, 144, 161 and 163; Acid Yellow 17, 19, 23, 25, 39, 40, 42, 44, 49, 50, 61, 64, 76, 79, 110, 127, 135, 143, 151, 159, 169, 174, 190, 195, 196, 197, 199, 218, 219, 222 and 227; Reactive Yellow 2, 3, 13, 14, 15, 17, 18, 23, 24, 25, 26, 27, 29, 35, 37, 41 and 42; and Basic Yellow 1, 2, 4, 11, 13, 14, 15, 19, 21, 23, 24, 25, 28, 29, 32, 36, 39 and 40 (wherein each of the numerical values represents a C. I. number).

A specific example of the dye capable of coloring into a green color is Acid Green 16 (wherein the numerical value represents a C. I. number).

Specific examples of the dye capable of coloring into a blue color include Acid Blue 9, 45, 80, 83, 90 and 185 (wherein each of the numerical values represents a C. I. number).

Specific examples of the dye capable of coloring into a purple color include: Direct Violet 7, 9, 47, 48, 51, 66, 90, 93, 94, 95, 98, 100 and 101; Acid Violet 5, 9, 11, 34, 43, 47, 48, 51, 75, 90, 103 and 126; Reactive Violet 1, 3, 4, 5, 6, 7, 8, 9, 16, 17, 22, 23, 24, 26, 27, 33 and 34; and Basic Violet 1, 2, 3, 7, 10, 15, 16, 20, 21, 25, 27, 28, 35, 37, 39, 40 and 48 (wherein each of the numerical values represents a C. I. number).

In addition, specific examples of the dye also include: "SUMILAN" (a registered trademark) dye and "LANYL dye" (a registered trademark) (manufactured by Sumitomo Chemical Co., Ltd.); "ORASOL" (a registered trademark) dye, "ORACET" (a registered trademark) dye, "FILAMID" (a registered trademark) dye and "IRGASPERSE" (a registered trademark) dye (products manufactured by Ciba Specialty Chemicals Co.); "ZAPON" (a registered trademark) dye, "NEOZAPON" (a registered trademark) dye, "NEPTUNE" (a registered trademark) dye and "ACIDOL" (a registered trademark) dye (manufactured by BASF); "KAYASET" (a registered trademark) dye and "KAYAKALAN" (a registered trademark) dye (manufactured by Nippon Kayaku Co., Ltd.); "VALIFAST" (a registered trademark) COLORS dye and "NUBIAN" (a registered trademark) COLORS dye (manufactured by Orient Chemical Industries, Co., Ltd.); "SAVINYL" (a registered trademark) dye, "SANDOPLAST" (a registered trademark) dye, "POLYSYNTHREN" (a registered trademark) dye and "LANASYN" (a registered trademark) dye (manufactured by Clariant (Japan) K.K.); "AIZEN" (a registered trademark), "SPILON" (a registered trademark) dye (manufactured by Hodogaya Chemical Co., Ltd.); a functional dye (manufactured by Yamada Chemical Co., Ltd.); and PLAST COLOR dye and OIL COLOR dye (manufactured by Arimoto Chemical Co., Ltd.).

The content ratio of the dye mixture composed of at least two types of dyes (F2a-2) in solid materials contained in the photosensitive resin composition to be used in the present invention excluding the organic solvent (C) is preferably 0.01% by weight or more, more preferably 0.05% by weight or more, still more preferably 0.1% by weight or more. When the content ratio falls within the above-mentioned range, it becomes possible to improve the light-blocking property and the color-toning property. On the other hand, the content ratio is preferably 50% by weight or less, more preferably 45% by weight or less, still more preferably 40% by weight or less. When the content ratio falls within the above-mentioned range, the sensitivity upon exposure to light can be improved.

The term "non-black dye (F2b)" refers to a dye which can color into a non-black color, i.e., a white, red, orange, yellow, green, blue or purple color, as the result of the absorption of light having a wavelength of visible light When the non-black dye (F2b) is contained, the film of the resin composition can be colored, and therefore a coloring property or a color-toning property can be imparted to the film. When at least two types of the non-black dyes (F2b) are used in combination, the color of the film of the resin composition can be colored into a color having a desired color coordinate and the color-toning property can be improved.

An example of the non-black dye (F2b) is a dye which can color into a non-black color, i.e., a white, red, orange, yellow, green, blue or purple color, as mentioned above.

The content ratio of the non-black dye (F2b) in solid materials contained in the photosensitive resin composition to be used in the present invention excluding the organic solvent (C) is preferably 0.01% by weight or more, more preferably 0.05% by weight or more, still more preferably 0.1% by weight or more. When the content ratio falls within the above-mentioned range, it becomes possible to improve the coloring property or the color-toning property. On the other hand, the content ratio is preferably 50% by weight or less, more preferably 45% by weight or less, still more preferably 40% by weight or less. When the content ratio falls within the above-mentioned range, the heat resistance of the cured film can be improved.

<(G) Dispersant>

It is also preferred that the photosensitive resin composition to be used in the present invention additionally contains (G) a dispersant.

The term "dispersant (G)" refers to a compound which has both a surface-affinity group that can interact with the surface of a disperse dye or the like which serves as the pigment (F1) or (F2) mentioned above and also has a dispersion-stabilizing structure for improving the dispersion stability of the pigment (F1) or the disperse dye. Examples of the dispersion-stabilizing structure of the dispersant (G) include a polymer chain and/or a substituent having a static electric charge. The dispersant (G) is expected to cause steric hindrance or electrostatic repulsion to exhibit a dispersion effect.

When the dispersant (G) is contained, in a case where the photosensitive resin composition contains the pigment (F1) or the disperse dye, the dispersion stability of the pigment (F1) or the disperse dye can be improved and, consequently, the resolution after development can be improved. Particularly in the case where the pigment (F1) is composed of ground particles having a number average particle diameter of 1 μm, the surface areas of the particles of the pigment (F1) increase and, consequently, the aggregation of the particles of the pigment (F1) is likely to occur. On the other hand, in the case where the pigment (F1) is contained, the aggregation of the particles of the pigment (F1) can be prevented and the dispersion stability of the particles can be improved as the result of the interaction between the surface of the ground the pigment (F1) and the surface-affinity group in the dispersant (G) and the steric hindrance and/or the electrostatic repulsion associated with the dispersion-stabilizing structure of the dispersant (G).

Examples of the dispersant (G) having a surface-affinity group include a dispersant having only an amine value, a dispersant having both an amine value and an acid value, a dispersant having only an acid value, and a dispersant having neither an amine value or an acid value. From the viewpoint of the dispersion stability of the particles of the the pigment (F1), a dispersant having only an amine value and a dispersant having both an amine value and an acid value are preferred.

The dispersant (G) having a surface-affinity group preferably has a structure such that the amino group and/or the acidic group that serves as the surface-affinity group forms a salt with an acid and/or a base.

Specific examples of the dispersant having only an amine value include "DISPERBYK" (a registered trademark)-108, -109, -160, -161, -162, -163, -164, -166, -167, -168, -182, -184, -185, -2000, -2008, -2009, -2022, -2050, -2055, -2150, -2155, -2163, -2164 and -2061, "BYK" (a registered trademark)-9075, -9077, -LP-N6919, -LP-N21116 and -LP-N21324 (manufactured by BYK Chemie Ltd. Japan), "EFKA" (a registered trademark) 4015, 4020, 4046, 4047, 4050, 4055, 4060, 4080, 4300, 4330, 4340, 4400, 4401, 4402, 4403 and 4800 (manufactured by BASF), "AJISPER" (a registered trademark) PB711 (manufactured by Ajinomoto Fine-Techno Co., Inc.) and "SOLSPERSE" (a registered trademark) 13240, 13940, 20000, 71000 and 76500 (manufactured by Lubrizol Corporation).

Specific examples of the dispersant having both an amine value and an acid value include "ANTI-TERRA" (a registered trademark)-U100 and -204, "DISPERBYK" (a registered trademark)-106, -140, -142, -145, -180, -2001, -2013, -2020, -2025, -187 and -191, "BYK" (a registered trademark)-9076 (manufactured by BYK Chemie Ltd. Japan, "AJISPER" (a registered trademark) PB821, PB880 or PB881 (manufactured by manufactured by Ajinomoto Fine-Techno Co., Inc.) and "SOLSPERSE" (a registered trademark) 9000, 11200, 13650, 24000, 32000, 32500, 32500, 32600, 33000, 34750, 35100, 35200, 37500, 39000, 56000 and 76500 (manufactured by Lubrizol Corporation)

Specific examples of the dispersant having only an acid value include "DISPERBYK" (a registered trademark)-102, -110, -111, -118, -170, -171, -174, -2060 and -2096, "BYK" (a registered trademark)-P104, -P105 and -220S (manufactured by BYK Chemie Ltd. Japan), and "SOLSPERSE" (a registered trademark) 3000, 16000, 17000, 18000, 21000, 26000, 28000, 36000, 36600, 38500, 41000, 41090, 53095 and 55000 (manufactured by Lubrizol Corporation).

Specific examples of the dispersant having neither an amine value or an acid value include "DISPERBYK" (a registered trademark)-103, -2152, -2200 and -192 (manufactured by BYK Chemie Ltd. Japan) and "SOLSPERSE" (a registered trademark) 27000, 54000 and X300 (manufactured by Lubrizol Corporation).

The amine value of the dispersant (G) is preferably 5 mgKOH/g or more, more preferably 8 mgKOH/g or more, still more preferably 10 mgKOH or more. When the amine value falls within the above-mentioned range, the dispersion stability of the pigment (F1) can be improved. On the other hand, the amine value is preferably 150 mgKOH/g or less, more preferably 120 mgKOH/g or less, still more preferably 100 mgKOH/g or less. When the amine value falls within the above-mentioned range, the storage stability of the resin composition can be improved.

The term "amine value" as used herein refers to the weight of potassium hydroxide which is equivalent to the weight of an acid that can react with 1 g of the dispersant (G), and is expressed in a unit "mgKOH/g". The amine value may also be determined by neutralizing 1 g of the dispersant (G) with an acid and then titrating with an aqueous potassium hydroxide solution. The amine equivalent (unit: g/mol), which is the weight of a resin per 1 mol of an amino group, can be calculated from the amine value, and the number of amino groups in the dispersant (G) can be determined.

The acid value of the dispersant (G) is preferably 5 mgKOH/g or more, more preferably 8 mgKOH/g or more, still more preferably 10 mgKOH or more. When the acid value falls within the above-mentioned range, the dispersion stability of the pigment (F1) can be improved. On the other hand, the acid value is preferably 200 mgKOH/g or less, more preferably 170 mgKOH/g or less, still more preferably 150 mgKOH/g or less. When the acid value falls within the above-mentioned range, the storage stability of the resin composition can be improved.

The term "acid value" as used herein refers to the weight of potassium hydroxide which can react with 1 g of the dispersant (G), and is expressed in a unit mgKOH/g. The acid value can be determined by titrating 1 g of the dispersant (G) with an aqueous potassium hydroxide solution. The acid equivalent (unit: g/mol), which is the weight of a resin per 1 mol of an acidic group, can be calculated from the acid value, and the number of acidic groups can be determined.

The dispersant (G) may be a dispersant having a polymer chain. Examples of the dispersant having a polymer chain include an acrylic resin-type dispersant, a polyoxyalkylene ether-type dispersant, a polyester-type dispersant, a polyurethane-type dispersant, a polyol-type dispersant, a polyethylene imine-type dispersant and a polyallylamine-type dispersant. From the viewpoint of the pattern processability with an alkaline developing solution, an acrylic resin-type dispersant, a polyoxyalkylene ether-type dispersant, a polyester-type dispersant, a polyurethane-type dispersant and a polyol-type dispersant are preferred.

In the case where the negative-type photosensitivity resin composition to be used in the present invention contains a disperse dye as the pigment (F1) and/or the dye (F2), the content ratio of the dispersant (G) in the negative-type photosensitivity resin composition to be used in the present invention is preferably 1% by weight or more, more preferably 5% by weight or more, still more preferably 10% by weight or more, reactive to the total amount, i.e., 100% by weight, of the pigment (F1) and/or the disperse dye and the dispersant (G). When the content ratio falls within the above-mentioned range, the dispersion stability of the pigment (F1) and/or the disperse dye can be improved and the resolution after development can be improved. On the other hand, the content ratio is preferably 60% by weight or less, more preferably 55% by weight or less, still more preferably 50% by weight or less. When the content ratio falls within the above-mentioned range, the heat resistance of the cured film can be improved.

<Other Component: Adhesion Modifier>

The photosensitive resin composition to be used in the present invention may contain an adhesion modifier. Specific examples of the adhesion modifier include: a silane coupling agent such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane and N-phenyl-3-aminopropyltrimethoxysilane; a titanium chelating agent; an aluminum chelating agent; and a compound produced by reacting an aromatic amine compound with a silicon compound containing an alkoxy group. Two or more of these compounds may be used in combination. When the adhesion modifier is contained, it becomes possible to increase the adhesion onto an underlying substrate (e.g., a silicon wafer, ITO, $SiO_2$, nitride silicon) during the development of the photosensitive resin film. In this case, it becomes also possible to improve the resistance to oxygen plasma that is used for washing purposes or a UV ozone treatment. The content of the adhesion modifier is preferably 0.1 to 10% by weight relative to the whole weight of the resin composition excluding the organic solvent (C).

<Other Component: Surfactant>

If necessary, the photosensitive resin composition to be used in the present invention may contain a surfactant for the purpose of improving the wettability to a substrate. The surfactant to be used may be a commercially available compound. Specific examples of the surfactant include, but not limited to: a silicone-type surfactant, such as a SH series, a SD series and a ST series manufactured by Dow Corning Toray Silicone Co., Ltd., a BYK series manufactured by BYK Chemie Ltd. Japan, a KP series manufactured by Shin-Etsu Silicone Co., Ltd., a DISFOAM series manufactured by NOF Corporation, and a TSF series manufactured by Toshiba Silicones Co., Ltd.; a fluorine-type surfactant, such as a "MEGAFACE (a registered trademark)" series manufactured by DIC Corporation, a Fluorad series manufactured by Sumitomo 3M Ltd., "SURFLON (a registered trademark)" series and a "AsahiGuard (a registered trademark)" series both manufactured by Asahi Glass Co., Ltd., an EF series manufactured by Shin Akita Kasei K. K., and a PolyFox series manufactured by OMNOVA Solutions Inc.; and a surfactant comprising an acrylic and/or methacrylic polymer, such as a POLYFLOW series manufactured by Kyoeisha Chemical Co., Ltd., and a "DISPARLON (a registered trademark)" series manufactured by Kusumoto Chemicals, Ltd.

The content of the surfactant is preferably 0.001 to 1% by weight relative to the whole weight of the positive-type photosensitive resin composition excluding the organic solvent (C).

<Other Component: Phenolic Hydroxy Group>

If necessary, the positive-type photosensitivity resin composition to be used in the present invention may contain a compound having a phenolic hydroxy group for the purpose of compensating the alkaline developability of the photosensitive resin composition. Specific examples of the compound having a phenolic hydroxy group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCRIPZ, BisOCP-IPZ, BisOIPP-CP, Bis26X-IPZ, BisOTBP-CP, TekP-4HBPA (tetrakis P-DO-BPA), TrisPHAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X and BisRS-OCHP (product names, manufactured by Honshu Kagaku Industry Co., Ltd.), BIR-OC, BIP-PC, BIR-PC, BIR-PTBP, BIR-PCHP, BIP-BIOC-F, 4PC, BIR-BIPC-F, TEP-BIP-A (product names, manufactured by Asahi Yukizai Corporation), 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, 2,4-dihydroxyquinoline, 2,6-dihydroxyquinoline, 2,3-dihydroxyquinoxaline, anthracene-1,2,10-triol, anthracene-1,8,9-triol and 8-quinolinol. When the compound having a phenolic hydroxy group is contained, the resultant photosensitive resin composition is very slightly soluble in an alkaline developing solution before exposure to light and becomes readily soluble in an alkaline developing solution after exposure to light. Therefore, the thickness loss caused by the development is small and the development can be carried out readily within a short time, resulting in the improvement in sensitivity.

The content of the compound having a phenolic hydroxy group is preferably 1 to 20% by weight inclusive relative to the whole weight of the positive-type photosensitivity resin composition excluding the organic solvent (C).

<Other Component: Sensitizer>

If necessary, the negative-type photosensitivity resin composition to be used in the present invention may contain a sensitizer.

The term "sensitizer" refers to a compound which can absorb an energy generated by the exposure to light to generate an excited triplet electron as the result of internal conversion and intersystem crossing and, consequently can mediate the transfer of the energy to the above-mentioned photopolymerization initiator (b2) and the like.

When the sensitizer is contained, the sensitivity upon exposure to light can be improved. This is probably because that the sensitizer absorbs light having a long wavelength, which cannot be absorbed with the photopolymerization initiator (b2) or the like, to generate an energy and the energy is transferred from the sensitizer to the photopolymerization initiator (b2) or the like, resulting in the improvement in photoreaction efficiency.

The sensitizer is preferably a thioxanthone-type sensitizer. Specific examples of thioxanthone-type sensitizer include thioxanthone, 2-methylthioxanthone, 2-chlorothioxanthone, 2-isopropylthioxanthone, 2,4-dimethylthioxanthone, 2,4-diethylthioxanthone and 2,4-dichlorothioxanthone.

The content of the sensitizer in the negative-type photosensitivity resin composition to be used in the present invention is preferably 0.01 part by weight or more, more preferably 0.1 part by weight or more, still more preferably 0.5 part by weight or more, particularly preferably 1 part by weight or more, relative to the total weight, i.e., 100 parts by weight, of the alkali-soluble resin having a carboxylic acid structure (A) and the radically polymerizable monomer (E). When the content falls within the above-mentioned range, the sensitivity upon exposure to light can be improved. On the other hand, the content is preferably 15 parts by weight or less, more preferably 13 parts by weight or less, still more preferably 10 parts by weight or less, particularly preferably 8 parts by weight or less. When the content falls within the above-mentioned range, the resolution after development can be improved and a low-tapered pattern form can be produced.

<Other Component: Chain Transfer Agent>

If necessary, the negative-type photosensitivity resin composition to be used in the present invention may contain a chain transfer agent.

The term "chain transfer agent" refers to a compound which can receive a radical from a polymer growth terminal of a polymer chain produced by radical polymerization upon exposure to light to mediate the transfer of the radical to another polymer chain.

When the chain transfer agent is contained, the sensitivity upon exposure to light can be improved. This is probably because a radical generated upon the exposure to light is transferred to another polymer chain by the action of the chain transfer agent to cause radical crosslinking to a deeper part in the film. Particularly in the case where the photosensitive resin composition contains the blackening agent (Fa) as the above-mentioned coloring agent (F), light for the exposure is absorbed by the blackening agent (Fa) and therefore the light sometimes cannot reach a deeper part of the film. In contrast, in the case where the chain transfer agent is contained, radical crosslinking can be achieved to a deeper part of the film as the result of the transfer of the radical by the action of the chain transfer agent, resulting in the improvement in sensitivity upon exposure to light.

In addition, when the chain transfer agent is contained, a low-tapered pattern form can be produced. This is probably because the molecular weight of a polymer chain produced by the radical polymerization upon the exposure to light can be controlled by the transfer of the radical by the chain transfer agent. Namely, it is considered as follows. When the chain transfer agent is contained, the production of a polymer chain having a significantly high molecular weight, which is caused by excessive radical polymerization upon exposure to light, can be prevented, resulting in the prevention of increase in the softening point of the resultant film. As a result, the reflowing property of a pattern during thermal curing is improved and a low-tapered pattern form can be produced.

The chain transfer agent is preferably a thiol-type chain transfer agent. Specific examples of the thiol-type chain transfer agent include β-mercaptopropionic acid, methyl β-mercaptopropionate, ethyl β-mercaptopropionate, 2-ethylhexyl β-mercaptopropionate, n-octyl β-mercaptopropionate, methoxybutyl β-mercaptopropionate, stearyl β-mercaptopropionate, isononyl β-mercaptopropionate, β-mercaptobutanoic acid, methyl β-mercaptobutanoate, ethyl β-mercaptobutanoate, 2-ethylhexyl β-mercaptobutanoate, n-octyl β-mercaptobutanoate, methoxybutyl β-mercaptobutanoate, stearyl β-mercaptobutanoate, isononyl β-mercaptobutanoate, methyl thioglycolate, n-octyl thioglycolate, methoxybutyl thioglycolate, 1,4-bis(3-mercaptobutanoyloxy)butane, 1,4-bis(3-mercaptopropionyloxy)butane, 1,4-bis(thioglycoloyloxy)butane, ethylene glycol bis(thioglycollate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycollate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis(thioglycollate), dipentaerythritol hexakis(3-mercaptopropionate) and dipentaerythritol hexakis(3-mercaptobutyrate). From the viewpoint of the improvement in the sensitivity upon exposure to light and the formation of a low-tapered pattern form, 1,4-bis(3-mercaptobutanoyloxy)butane, 1,4-bis(3-mercaptopropionyloxy)butane, 1,4-bis(thioglycoloyloxy)butane, ethylene glycol bis(thioglycollate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycollate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis(thioglycollate), dipentaerythritol hexakis(3-mercaptopropionate) and dipentaerythritol hexakis(3-mercaptobutyrate) are preferred.

The content of the chain transfer agent in the negative-type photosensitivity resin composition to be used in the present invention is preferably 0.01 part by weight or more, more preferably 0.1 part by weight or more, still more preferably 0.5 part by weight or more, particularly preferably 1 part by weight or more, relative to the total weight, i.e., 100 parts by weight, of the alkali-soluble resin having a carboxylic acid structure (A) and the radically polymerizable monomer (E). When the content falls within the above-mentioned range, the sensitivity upon exposure to light can be improved and a low-tapered pattern form can be produced. On the other hand, the content is, preferably 15 parts by weight or less, more preferably 13 parts by weight or less, still more preferably 10 parts by weight or less, particularly preferably 8 parts by weight or less. When the content falls within the above-mentioned range, the resolution after development and the heat resistance of the cured film can be improved.

<Other Component: Polymerization Inhibitor>

If necessary, the negative-type photosensitivity resin composition to be used in the present invention may contain a polymerization inhibitor.

The term "polymerization inhibitor" refers to a compound which can capture a radical generated upon the exposure to light or a radical located at a polymer growth end of a polymer chain produced by the radical polymerization upon the exposure to light and can hold the radical therein in the form of a stable radical to terminate the radical polymerization.

When a proper amount of the polymerization inhibitor is contained, the formation of residues after development can be prevented and the resolution after development can be improved. This is probably because the polymerization inhibitor captures an excessive amount of a radical generated upon the exposure to light or an excessive amount of a radical located at a polymer growth end of a high-molecular-weight polymer chain to inhibit the progression of excessive radical polymerization.

The polymerization inhibitor is preferably a phenol-type compound polymerization inhibitor. Specific examples of the phenol-type compound polymerization inhibitor include 4-methoxyphenol, 1,4-hydroquinone, 1,4-benzoquinone, 2-t-butyl-4-methoxyphenol, 3-t-butyl-4-methoxyphenol, 4-t-butylpyrocatechol, 2,6-di-t-butyl-4-methylphenol, 2,5-di-t-butyl-1,4-hydroquinone, 2,5-di-t-amyl-1,4-hydroquinone, and "IRGANOX" (a registered trademark) 1010, 1035, 1076, 1098, 1135, 1330, 1726, 1425, 1520, 245, 259, 3114, 565 and 295 (manufactured by BASF).

The content of the polymerization inhibitor in the negative-type photosensitivity resin composition to be used in the present invention is preferably 0.01 part by weight or more, more preferably 0.03 part by weight or more, still more preferably 0.05 part by weight or more, particularly preferably 0.1 part by weight or more, relative to the total weight, i.e., 100 parts by weight, of the alkali-soluble resin having a carboxylic acid structure (A) and the radically polymerizable monomer (E). When the content falls within the above-mentioned range, the resolution after development and the heat resistance of the cured film can be improved. On the other hand, the content is preferably 10 parts by weight or less, more preferably 8 parts by weight or less, still more preferably 5 parts by weight or less, particularly preferably 3 parts by weight or less. When the content falls within the above-mentioned range, the sensitivity upon exposure to light can be improved.

<Other Component: Silane Coupling Agent>

If necessary, the negative-type photosensitivity resin composition to be used in the present invention may contain a silane coupling agent.

The term "silane coupling agent" refers to a compound having a hydrolyzable silyl or silanol group.

When the silane coupling agent is contained, the interaction at the interface between the cured film of the photosensitive resin composition and a substrate (i.e., under layer) can be increased and, therefore, the adhesion to the substrate (i.e., under layer) and the chemical resistance of the cured film can be improved.

The silane coupling agent is preferably a trifunctional organosilane, a tetrafunctional organosilane or a silicate compound.

Specific examples of the trifunctional organosilane include methyltrimethoxysilane, methyltriethoxysilane, methyltri-n-propoxysilane, ethyltrimethoxysilane, n-propyltrimethoxysilane, isopropyltrimethoxysilane, n-butyltrimethoxysilane, n-hexyltrimethoxysilane, n-octyltrimethoxysilane, n-decyltrimethoxysilane, cyclopentyltrimethoxysilane, cyclohexyltrimethoxysilane, vinyltrimethoxysilane, vinyltriethoxysilane, 3-methacryloyloxypropyltrimethoxysilane, 3-methacryloyloxypropyltriethoxysilane, 3-acryloyloxypropyltrimethoxysilane, 3-acryloyloxypropyltriethoxysilane, phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 2-(3-trimethoxysilylpropyl)-4-(N-t-butyl)amino-4-oxobutanoic acid, 3-(3-trimethoxysilylpropyl)-4-(N-t-butyl)amino-4-oxobutanoic acid, 3-trimethoxysilylpropylsuccinic acid, 3-triethoxysilylpropylsuccinic acid, 3-trimethoxysilylpropionic acid, 4-trimethoxysilylbutyric acid, 5-trimethoxysilylvaleric acid, 3-trimethoxysilylpropylsuccinic anhydride, 3-triethoxysilylpropylsuccinic anhydride, 4-(3-trimethoxysilylpropyl) cyclohexane-1,2-dicarboxylic anhydride, 4-(3-trimethoxysilylpropyl)phthalic anhydride, trifluoromethyltrimethoxysilane, trifluoromethyltriethoxysilane, 3,3,3-trifluoropropyltrimethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltri- methoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, N-(vinylbenzyl)-2-aminoethyl-3-ami- nopropyltrimethoxysilane hydrochloride, 3-(4-aminophenyl)propyltrimethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethy- lbutylidene)propylamine, 3-triethoxysilyl-N-(1,3-dimethylbutylidene)propylamine, 3-mercaptopropyltrimethoxysilane, 3-mercaptopropyltriethoxysilane, 3-isocyanatepropyltrimethoxysilane, 3-isocyanatepropyltriethoxysilane, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl) succinimide and N-t-butyl-2-(3-triethoxysilylpropyl) succinimide.

An example of the tetrafunctional organosilane or the silicate compound is an organosilane represented by general formula (68).

[chemical formula 5]

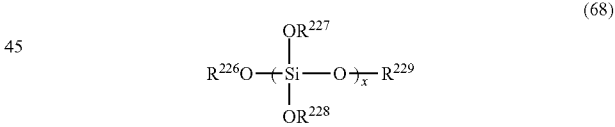

(68)

In general formula (68), $R^{226}$ to $R^{229}$ independently represent a hydrogen atom, an alkyl group, an acyl group or an aryl group; and x represents an integer of 1 to 15. In general formula (68), $R^{226}$ to $R^{229}$ preferably independently represent a hydrogen atom, an alkyl group having 1 to 6 carbon atoms, an acyl group having 2 to 6 carbon atoms or an aryl group having 6 to 15 carbon atoms, more preferably independently represent a hydrogen atom, an alkyl group having 1 to 4 carbon atoms, an acyl group having 2 to 4 carbon atoms or an aryl group having 6 to 10 carbon atoms. Each of the alkyl group, the acyl group and the aryl group may be in an unsubstituted form or a substituted form.

Specific examples of the organosilane represented by general formula (68) include: a tetrafunctional organosilane such as tetramethoxysilane, tetraethoxysilane, tetra-n-propoxysilane, tetraisopropoxysilane, tetra-n-butoxysilane and tetraacetoxysilane; and a silicate compound such as methyl silicate 51 (manufactured by Fuso Chemical Co., Ltd.), M silicate 51, silicate 40 and silicate 45 (manufactured by Tama Chemicals Co., Ltd.), and methyl silicate 51, methyl silicate 53A, ethyl silicate 40 and ethyl silicate 48 (manufactured by Colcoat Co., Ltd.).

Among these silane coupling agents, the following compounds are preferred from the viewpoint of the improvement in the adhesion to an underlying substrate and the chemical resistance of the cured film: a trifunctional organosilane such as vinyltrimethoxysilane, vinyltriethoxysilane, 3-methacryloyloxypropyltrimethoxysilane, 3-methacryloyloxypropyltriethoxysilane, 3-acryloyloxypropyltrimethoxysilane, 3-acryloyloxypropyltriethoxysilane, 1-naphthyltrimethoxysilane, 2-naphthyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltrimethoxysilane, 3-aminopropyltriethoxysilane, N-phenyl-3-aminopropyltrimethoxysilane, 3-(4-aminophenyl)propyltrimethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethylbutylidene)propylamine, 3-triethoxysilyl-N-(1,3-dimethylbutylidene)propylamine, 3-isocyanatepropyltrimethoxysilane, 3-isocyanatepropyltriethoxysilane, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl)succinimide and N-t-butyl-2-(3-triethoxysilylpropyl)succinimide; a tetrafunctional organosilane such as tetramethoxysilane, tetraethoxysilane, tetra-n-propoxysilane, tetraisopropoxysilane, tetra-n-butoxysilane and tetraacetoxysilane; and a silicate compound such as methyl silicate 51 (manufactured by Fuso Chemical Co., Ltd.), M silicate 51, silicate 40 and silicate 45 (manufactured by Tama Chemicals Co., Ltd.), and methyl silicate 51, methyl silicate 53A, ethyl silicate 40 and ethyl silicate 48 (manufactured by Colcoat Co., Ltd.).

The content of the silane coupling agent in the negative-type photosensitivity resin composition to be used in the present invention is preferably 0.01 part by weight or more, more preferably 0.1 part by weight or more, still more preferably 0.5 part by weight or more, particularly preferably 1 part by weight or more, relative to the total weight, i.e., 100 parts by weight, of the alkali-soluble resin having a carboxylic acid structure (A) and the radically polymerizable monomer (E). When the content falls within the above-mentioned range, the adhesion to a substrate (i.e., under layer) and the chemical resistance of the cured film can be improved. On the other hand, the content is preferably 15 parts by weight or less, more preferably 13 parts by weight or less, still more preferably 10 parts by weight or less, particularly preferably 8 parts by weight or less. When the content falls within the above-mentioned range, the resolution after development can be improved.

<Other Additives>

The photosensitive resin composition to be used in the present invention may additionally contain another resin or a precursor thereof. Examples of the "other resin" or the precursor thereof include a polyamide, a polyamideimide, an epoxy resin, a novolac resin, a urea resin, a polyurethane and precursors thereof.

The photosensitive resin composition to be used in the present invention may additionally contain inorganic particles. Preferred examples include, but not limited to, silicon oxide, titanium oxide, barium titanate, alumina and talc. The primary particle diameter of each of the inorganic particles is preferably 100 nm or less, more preferably 60 nm or less.

The content of the inorganic particles is preferably 5 to 90% by weight relative to the whole weight of the positive-type photosensitive resin composition excluding the organic solvent (C).

The photosensitive resin composition to be used in the present invention may contain a thermal acid generator, as long as the long-term reliability of the organic EL display device cannot be deteriorated. The thermal acid generator can generate an acid by heating to accelerate the cross-linking reaction of the thermally cross-linking agent (D). When the alkali-soluble resin having a carboxylic acid structure (A) has a ring-unopened imide or oxazole ring structure, the thermal acid generator can accelerate the cyclization of the alkali-soluble resin having a carboxylic acid structure (A) to further improve the mechanical properties of the cured film.

The thermal decomposition initiation temperature of the thermal acid generator to be used in the present invention is preferably 50° C. to 270° C., more preferably 250° C. or lower. Preferably selected is a thermal acid generator which does not generate an acid upon the drying (prebaking: about 70 to 140° C.) after the application of the photosensitive resin composition to be used in the present invention onto a substrate and generates an acid upon a heating treatment (curing: about 100 to 400° C.) after exposure to light and subsequent patterning by development. This is because the deterioration in sensitivity upon development can be prevented.

The acid generated from the thermal acid generator to be used in the present invention is preferably a strong acid, and is preferably an arylsulfonic acid (e.g., p-toluenesulfonic acid, benzenesulfonic acid), an alkylsulfonic acid (e.g., methanesulfonic acid, ethanesulfonic acid, propanesulfonic acid, butanesulfonic acid), a haloalkylsulfonic acid (e.g., trifluoromethylsulfonic acid) or the like. The acid is used in the form of a salt (e.g., an onium salt) or a covalently bonded compound (e.g., an imide sulfonate). Two or more of these acids may be contained.

The content of the thermal acid generator to be used in the present invention is preferably 0.01% by weight or more, more preferably 0.1% by weight or more, relative to the whole weight of the positive-type photosensitive resin composition excluding the organic solvent (C). When the thermal acid generator is contained in an amount of 0.01% by weight or more, the cross-linking reaction and the cyclization of the ring-unopened structure in the resin can be accelerated, resulting in the improvement in the mechanical properties and chemical resistance of the cured film. From the viewpoint of the electrical insulation property of the cured film, the content is preferably 5% by weight or less, more preferably 3% by weight or less.

The method for manufacturing the organic EL display device according to the present invention is a method for manufacturing the organic EL display device of the present invention, and a bleaching treatment is included in the step of forming an insulating layer.

Hereinbelow, the method for manufacturing a cured film using the photosensitive resin composition to be used in the present invention will be described in detail. The photosensitive resin composition to be used in the present invention is applied onto a base material by a spin coating method, a slit coating method, a dip coating method, a spray coating method, a printing method or the like to produce a coating film of the photosensitive resin composition. Prior to the application, the base material onto which the photosensitive resin composition is to be applied may be pretreated with the above-mentioned adhesion modifier. An example is a method in which the surface of the base material is treated with a solution which is prepared by dissolving the adhesion modifier in a solvent (e.g., isopropanol, ethanol, methanol, water, tetrahydrofuran, propylene glycol monomethyl ether acetate, propylene glycol monomethyl ether, ethyl lactate, diethyl adipate) at a concentration of 0.5 to 20% by weight. Examples of the method for treating the surface of the base material surface include a spin coating method, a slit die coating method, a bar coating method, a dip coating method, a spray coating method and a steam treatment. After the application, the coating film may be optionally subjected to a reduced-pressure drying treatment, and is then subjected to a heating treatment at 50° C. to 180° C. for 1 minute to several hours using a hot plate, an oven, infrared ray or the like to produce a photosensitive resin film.

Next, the method for forming a pattern from the photosensitive resin film will be described. An actinic ray is emitted onto the photosensitive resin film through a mask having a desired pattern. Examples of the actinic ray to be employed for the exposure to light include ultraviolet ray, visible light, electron beam and X-ray. In the present invention, i-line (365 nm), h-line (405 nm) or g-line (436 nm) of a mercury lamp can be used preferably.

After the exposure to light, an exposed area for the case of a positive-type or an unexposed area for the case where a negative-type is removed using a developing solution. The developing solution is preferably an aqueous solution of a compound having alkaline properties, such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine. If required, a polar solvent (e.g., N-methyl-2-pyrrolidone, N,N-dimethylformamide, N,N-dimethylacetamide, dimethyl sulfoxide, γ-butyrolactone and dimethylacrylamide), an alcohol (e.g., methanol, ethanol and isopropanol), an ester (e.g., ethyl lactate, propylene and glycol monomethyl ether acetate), a ketone (e.g., cyclopentanone, cyclohexanone, isobutyl ketone and methyl isobutyl ketone) may be added singly or in the form of a combination of two or more of them to the alkaline aqueous solution. As the developing method, a method of a spray mode, a paddle mode, a dip mode, an ultrasonic mode and the like can be employed.

Subsequently, it is preferred that the pattern formed by the development is rinsed with distilled water. If necessary, an alcohol (e.g., ethanol, isopropyl alcohol), an ester (e.g., ethyl lactate, propylene glycol monomethyl ether acetate) may be added to distilled water for the rising treatment.

Next, it is preferred to carry out a bleaching treatment for the purpose of reducing the amount of acid anhydrides in the patterned photosensitive resin film. As one example, a quinone diazide compound which is a positive-type photosensitizing agent can be converted to an indene carboxylic acid by the bleaching treatment to prevent the generation of acid anhydrides. The bleaching treatment by which the quinone diazide compound can be converted may be carried out after the heating curing step. The term "bleaching treatment" as used herein refers to a treatment of irradiating with an actinic ray (e.g., ultraviolet ray, visible light, electron beam, X-ray), and it is preferred to irradiate with i-line (365 nm), h-line (405 nm) or g-line (436 nm) of a mercury lamp at a dose of 10 to 10000 $mJ/cm^2$.

Subsequently, a heating treatment is carried out. When the heating treatment is carried out, a remaining solvent or a component having low heat resistance can be removed, resulting in the improvement in heat resistance and chemical resistance. Particularly in the case where the photosensitive resin composition to be used in the present invention contains an alkali-soluble resin selected from a polyimide precursor and a polybenzoxazole precursor or a copolymer of each of the precursor or a copolymer of each of the precursor and polyimide, an imide ring or an oxazole ring can be formed by the heating treatment, and therefore heat resistance and chemical resistance can be improved. In the case where the photosensitive resin composition to be used in the present invention contains a compound having at least two groups selected from an alkoxymethyl group, a methylol group, an epoxy group and an oxetanyl group, the cross-linking reaction can be allowed to proceed by a heating treatment, and heat resistance and chemical resistance can be improved. There are found suitable temperature conditions for the heating treatment, and the heating treatment is carried out for 5 minutes to 5 hours while rising the temperature stepwise or while rising the temperature continuously within a certain temperature range. As one example, the heating treatment is carried out for 30 minutes at each of 150° C. and 250° C. Alternatively, a method in which the temperature is increased linearly from room temperature to 300° C. over 2 hours can also be mentioned. The condition for the heating treatment to be employed in the present invention is preferably from 150° C. to 400° C., more preferably 200° C. to 350° C. inclusive.

EXAMPLES

Hereinbelow, the present invention will be described by way of examples and others. However, the present invention is not limited by the examples. The evaluation of photosensitive resin compositions produced in the examples was carried out in the following manner.
(1) Method for Evaluating Sensitivity
(1-1) Positive-Type
<Production of Developed Film for Sensitivity Evaluation Use>

A varnish was applied onto an 8-inch silicon wafer by a spin coating method using a coater/developer Mark-7 (manufactured by Tokyo Electron Limited), and the resultant product was backed on a hot plate at 120° C. for 3 minutes to produce a prebaked film having a film thickness of 3.0 μm. Subsequently, the prebaked film was exposed to light using an exposure system i-line stepper NSR-2005i9C (manufactured by Nikon Corporation) through a mask having a 10-μm contact hole pattern at an exposure amount of 100 to 1200 $mJ/cm^2$ in 50 $mJ/cm^2$ steps. After the exposure to light, the exposed film was developed with a 2.38-wt % aqueous tetramethyl ammonium solution (abbreviated as "TMAH", hereinafter, manufactured by Tama Chemicals Co., Ltd.) using the developer Mark-7 for a time necessary to achieve a thickness loss of 0.5 μm in the development, and the developed product was rinsed with distilled water and then dried by shaking off to produce a pattern.
<Measurement of Film Thickness>

The thickness of the film was measured using Lambda Ace STM-602 manufactured by Dainippon Screen Mfg. Co., Ltd. at a refractive index of 1.63.
<Calculation of Sensitivity>

The pattern of the developed film produced by the above-mentioned method was observed with a FDP microscope MX61 (manufactured by Olympus Corporation) at a magnification of 20×, the minimum necessary exposure amount at which the opening diameter of the contact hole reached 10 μm was determined, and the value of the minimum necessary exposure amount was defined as sensitivity.

(1-2) Negative-Type

Pattern exposure was carried out by the method described in Example 11 below using a double-side alignment single-sided exposure machine (Mask Aligner PEM-6M; manufactured by Union Optical Co., LTD.) through a gray scale mask for sensitivity measurement use (MDRM MODEL 4000-5-FS; manufactured by Opto-Line International) with i-line (wavelength: 365 nm), h-line (wavelength: 405 nm) and g-line (wavelength: 436 nm) of a super high-pressure mercury lamp, and then the development was carried out using a small-size developer for photolithographic use (AD-2000; manufactured by Takizawa Co., Ltd.) to produce a developed film of a composition.

The resolution pattern of the developed film was observed with a FPD test microscope (MX-61L; manufactured by Olympus Corporation), and the sensitivity was determined as an exposure amount (a value on an i-line illuminometer) at which a 20-μm line-and-space pattern was formed at a 1:1 width ratio.

(2) Method for Evaluation of FT-IR

<Production of Cured Film for FT-IR Evaluation Use>

The schematic configuration of the substrate used above is shown in FIG. 2. First, an ITO transparent conductive film having a thickness of 100 nm was formed on the whole surface of a 38×46-cm non-alkali glass substrate 9 by a sputtering method, and was then etched to form a first electrode 10. Simultaneously, an auxiliary electrode 11 was also formed for taking out a second electrode. The substrate was washed with ultrasonic waves for 10 minutes using "Semico Clean 56" (a product name, manufactured by Furuuchi Chemical Corporation), and was then washed with ultra-pure water. Subsequently, each of photosensitive resin compositions (varnishes) produced in some of Reference Examples shown in Table 3 which corresponded to Examples was applied onto the whole surface of the substrate by a spin coating method, and was then prebaked on a hot plate at 120° C. for 2 minutes. The film was exposed to UV ray through a photomask and was then developed with a 2.38% aqueous TMAH solution to dissolve only an exposed area, and was then rinsed with pure water. The polyimide precursor pattern thus produced was cured in an oven at 250° C. for 60 minutes under a nitrogen atmosphere. In this manner, an insulating layer 12 having a configuration such that opening sections each having a width of 50 μm and a length of 260 μm was arranged at a pitch of 155 μm in the width direction and a pitch of 465 μm in the length direction and each of the opening sections had a shape that enabled the exposure of the first electrode was formed only on an active area. In this manner, an insulating layer having an insulating layer opening ratio of 18% was provided on a substrate active area that had a 16 mm-square tetragonal shape, and the thickness of the insulating layer was about 2.0 μm.

<Measurement of Absorption Spectra and Calculation of Index (a) and Residual Amount of Acid Anhydrides>

Absorption spectra was measured by an ATR method using Varian 7000 (manufactured by Varian). The conditions for the measurement were as follows: the detector was DTGS (Deuterium Tri-Glycine Sulfate) detector, the ATR crystal was Ge, the incident angle was 45°, and the reaction system was purged with a nitrogen gas during the measurement. Among the spectra thus obtained, an intensity at a wavenumber of 1436 cm$^{-1}$ that corresponded to an aromatic ring and an intensity at a wavenumber of 1853 cm$^{-1}$ that corresponded to an acid anhydride were used. The index (a) was calculated using these intensities in accordance with the general formula shown below. The index (a) was employed as the residual amount of acid anhydrides.

index (a)=(intensity at 1853 cm$^{-1}$)/(intensity at 1436 cm$^{-1}$)  General formula:

<Calibration Curve of Concentration Cx of Acid Anhydrides>

In order to control the concentration Cx of acid anhydrides in a cured film by varying the charge amount of phthalic anhydride, an alkali-soluble resin (AS) was produced in the following manner.

Under a dried nitrogen stream, BAHF (15.46 g (0.04225 mole)) and SiDA (0.62 g (0.0025 mole)) were dissolved in NMP (250 g). ODPA (15.5 g (0.05 mole)) was added together with NMP (50 g) to the solution, and the resultant mixture was stirred at 30° C. for 2 hours. Subsequently, MAP (manufactured by Tokyo Chemical Industry Co., Ltd.) (1.09 g (0.01 mole)) was added to the solution, and the resultant solution was further stirred at 40° C. for 2 hours. A solution prepared by diluting pyridine (manufactured by Tokyo Chemical Industry Co., Ltd.) (2.5 g) with toluene (manufactured by Tokyo Chemical Industry Co., Ltd.) (15 g) was added to the solution, and the resultant reaction solution was reacted at 120° C. for 2 hours and further reacted at 180° C. for 2 hours while azeotropically removing water together with toluene out of the system through a condenser tube attached to the system. The solution was cooled to room temperature and then introduced into water (2 L), and precipitates of a polymer solid material were collected by filtration. The precipitates were further washed with water (2 L) three times, and the collected polymer solid material was dried with a vacuum dryer at 50° C. for 72 hours to produce a polyimide resin (AS).

The synthesis of a quinone diazide compound (B-1) will be described below.

The alkali-soluble resin (AS) produced above, the quinone diazide compound (B-1) and phthalic anhydride were dissolved in propylene glycol monomethyl ether (also referred to as "PGME", hereinafter) (32.0 g) and γ-butyrolactone (also referred to as "GBL", hereinafter) (8.0 g), and the resultant solution was filtrated through a 0.2-μm polytetrafluoroethylene filter (manufactured by Sumitomo Electric Industries, Ltd.). In this manner, photosensitive resin compositions (varnishes) I to M were produced. The types and amounts of the compounds are shown in Table 1.

TABLE 1

| Photosensitive resin composition | (A) Alkali-soluble resin having carboxylic acid structure | (B) Photosensitizing agent | (C) Organic solvent | Phthalic anhydride |
|---|---|---|---|---|
| I | AS 10.0 g | B-1 1.2 g | PGME/GBL 32.0 g/8.0 g | 0.0 g |
| J | AS 10.0 g | B-1 1.2 g | PGME/GBL 32.0 g/8.0 g | 0.0126 g |

TABLE 1-continued

| Photosensitive resin composition | (A) Alkali-soluble resin having carboxylic acid structure | (B) Photosensitizing agent | (C) Organic solvent | Phthalic anhydride |
|---|---|---|---|---|
| K | AS 10.0 g | B-1 1.2 g | PGME/GBL 32.0 g/8.0 g | 0.084 g |
| L | AS 10.0 g | B-1 1.2 g | PGME/GBL 32.0 g/8.0 g | 0.168 g |
| M | AS 10.0 g | B-1 1.2 g | PGME/GBL 32.0 g/8.0 g | 0.342 g |

Cured films were produced by the above-mentioned method using the varnishes, and absorption spectra of the cured films were measured. The results are shown in Table 4. A calibration curve produced on the basis of Table 2 is shown in FIG. 3. The concentration Cx of acid anhydrides in each of the cured films was calculated from the index (a) utilizing the calibration curve.

TABLE 2

| | Insulating layer | Concentration of acid | Absorption intensity meASured by FT-IR and index (a) | | |
|---|---|---|---|---|---|
| | Photosensitive resin composition | anhydrides Cx mmol/g | Intensity at 1853 cm$^{-1}$ | Intensity at 1436 cm$^{-1}$ | Index (a) |
| Calibration curve 1 | I | 0 | 0.00000 | 0.00650 | 0.000 |
| Calibration curve 2 | J | 0.0075 | 0.00002 | 0.00518 | 0.004 |
| Calibration curve 3 | K | 0.05 | 0.00014 | 0.00530 | 0.026 |
| Calibration curve 4 | L | 0.10 | 0.00027 | 0.00445 | 0.061 |
| Calibration curve 5 | M | 0.20 | 0.00052 | 0.00448 | 0.116 |

(3) Method for Evaluation of Long-Term Reliability

<Production of Organic EL Display Device>

An organic EL display device was produced using a substrate having, formed thereon, a reflective electrode, a first electrode and an insulating layer in the same manner as in section (2). A nitrogen plasma treatment was carried out as a pretreatment, and then an organic EL layer 13 containing a light-emitting layer was formed by a vacuum deposition method. The vacuum degree during the deposition process was 1×10$^{-3}$ Pa or less, and the substrate was rotated relative to a deposition source during the deposition process. First, a compound (HT-1) was deposited at a thickness of 10 nm as a hole injection layer, and a compound (HT-2) was deposited at a thickness of 50 nm as a hole-transport layer. Subsequently, a compound (GH-1) that served as a host material and a compound (GD-1) that served as a dopant material were deposited as a light-emitting layer at a thickness of 40 nm in such a manner that the dope concentration became 10%. Subsequently, a compound (ET-1) and a compound (LiQ) that served as electron transport materials were laminated at a thickness of 40 nm and at a volume ratio of 1:1. The structures of the compounds used in the organic EL layer are as follows.

[chemical formula 6]

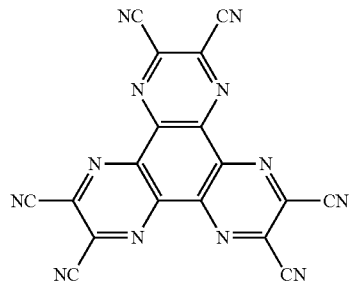

HT-1

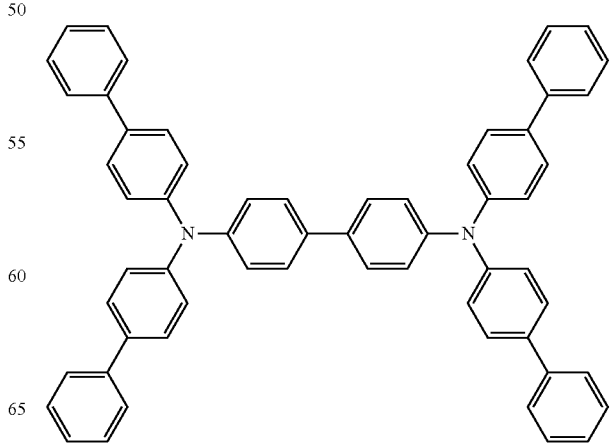

HT-2

-continued

GH-1

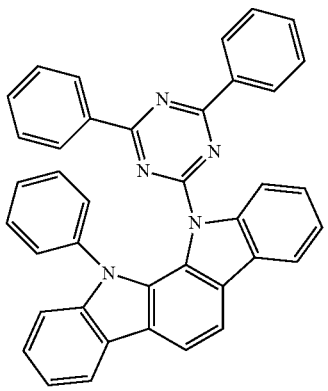

GD-1

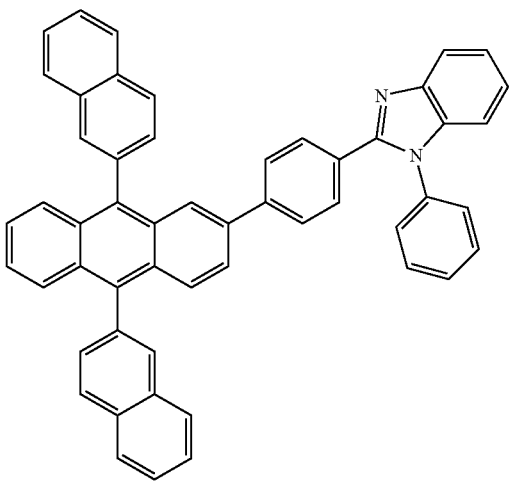

LiQ

ET-1

Subsequently, the compound (LiQ) was deposited at a thickness of 2 nm, and then Mg and Ag were deposited at a thickness of 60 nm at a volume ratio of 10:1 to produce a second electrode 14. Finally, the resultant product was sealed by bonding a cap-shaped glass plate using an epoxy resin-type adhesive agent under a low-moisture nitrogen atmosphere. In this manner, four light-emitting devices each having a 5 mm-square tetragonal shape were produced on a single substrate. The term "film thickness" as used herein refers to a displayed value on a quartz oscillation-type film thickness monitor.

<Evaluation of Long-Term Reliability>

The organic EL display device thus produced was placed on a hot plate that was heated to 80° C. with the light-emitting surface thereof facing up, and was then irradiated with UV ray having a wavelength of 365 nm and an illuminance of 0.6 mW/cm². After a lapse of 250 hours, 500 hours and 1000 hours, the display device was flashed by means of direct-current driving at 10 mA/cm², and the ratio of the area of the light-emitting part to the area of the light-emitting pixel (i.e., pixel luminescence area ratio) was measured. In this evaluation method, it was determined that the long-term reliability was excellent when the pixel luminescence area ratio after a lapse of 1000 hours was 80% or more, and a result that the pixel luminescence area ratio after a lapse of 1000 hours was 90% or more was more preferred.

Synthesis Example 1: Synthesis of Hydroxyl Group-Containing Diamine Compound 2,2-Bis(3-amino-4-hydroxyphenyl)hexafluoropropane (also referred to as "BAHF", hereinafter) (18.3 g (0.05 mole)) was dissolved in acetone (100 mL) and propylene oxide (17.4 g (0.3 mole)), and the resultant solution was cooled to −15° C. A solution prepared by dissolving 3-nitrobenzoyl chloride (20.4 g (0.11 mole)) in acetone (100 mL) was added dropwise to the cooled solution. After the dropwise addition, the solution was reacted at −15° C. for 4 hours and then the solution was allowed to warm to room temperature. A precipitated white solid material was collected by filtration and then dried under a reduced pressure at 50° C.

The solid material (30 g) was placed in a 300-mL stainless autoclave and then dispersed in methyl cellosolve (250 mL), and 5% palladium-carbon (2 g) was added to the solution. Hydrogen was introduced into the solution using a balloon to carry out a reduction reaction at room temperature. After about 2 hours, the reaction was completed when it was confirmed that the balloon could not deflate any more. After the completion of the reaction, the solution was filtered to remove a catalyst, i.e., a palladium compound, and the filtrate was concentrated with a rotary evaporator to produce a hydroxyl group-containing diamine compound represented by the following formula.

[chemical formula 7]

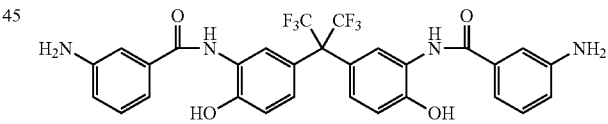

Synthesis Example 2: Synthesis of Alkali-Soluble Resin (A-1)

Under a dried nitrogen stream, BAHF (29.30 g (0.08 mole)), 1,3-bis(3-aminopropyl)tetramethyldisiloxane (1.24 g (0.005 mole, SiDA)) and 3-aminophenol (3-APh, manufactured by Tokyo Chemical Industry Co., Ltd.) (3.27 g (0.03 mole)) that served as an end-capping agent were dissolve in N-methyl-2-pyrrolidone (also referred to as "NMP", hereinafter) (80 g). 3,3',4,4'-Diphenyl ether tetracarboxylic dianhydride (31.2 g (Manac Incorporated, 0.1 mole, ODPA)) was added together with NMP (20 g) to the solution, and the resultant solution was reacted at 20° C. for 1 hour and was reacted at 50° C. for 4 hours. Subsequently, xylene (15 g) was added to the reaction solution, and the resultant mixture was stirred at 150° C. for 5 hours while azeotropically distilling water together with xylene. After the completion of the stirring, the solution was introduced into water (3 l) to produce white precipitates. The precipitates were collected by filtration, then washed with water three times, and then dried with a vacuum dryer at 80° C. for 20 hours to produce an alkali-soluble resin (A-1) which was a polyimide. The polymer solid material was subjected to an infrared spectroscopic measurement, and absorption peaks corresponding to imide structures derived from polyimide were detected around 1780 $cm^{-1}$ and 1377 $cm^{-1}$.

Synthesis Example 3: Synthesis of Alkali-Soluble Resin (A-2)

Under a dried nitrogen stream, ODPA (31.0 g (0.10 mole)) was dissolved in NMP (500 g). The hydroxyl group-containing diamine compound (45.35 g (0.075 mole)) produced in Synthesis Example 1 and 1,3-bis(3-aminopropyl)tetramethyldisiloxane (1.24 g (0.005 mole)) were added together with NMP (50 g) to the solution, and the resultant mixture was reacted at 20° C. for 1 hour and was then further reacted at 50° C. for 2 hours. Subsequently, 4-aminophenol (4.36 g (0.04 mole)) that served as an end-capping agent was added together with NMP (5 g) to the reaction solution, and the resultant mixture was reacted at 50° C. for 2 hours. Subsequently, a solution prepared by diluting N,N-dimethylformamide dimethyl acetal (41.7 g (0.35 mole)) with NMP (50 g) was added dropwise to the reaction solution over 10 minutes. After the completion of the dropwise addition, the solution was stirred at 50° C. for 3 hours. After the completion of the stirring, the solution was cooled to room temperature and the solution was introduced into water (3 L) to produce white precipitates. The precipitates were collected by filtration, then washed with water three times, and then dried with a vacuum dryer at 80° C. for 24 hours to produce an alkali-soluble resin (A-2) that was a polyimide precursor.

Synthesis Example 4: Synthesis of Alkali-Soluble Resin (A-3)

The same procedure as in Synthesis Example 3 was carried out, except that N,N-dimethylformamide dimethyl acetal was used in an amount of 23.8 g (0.20 mole), thereby producing an alkali-soluble resin (A-3) that was a polyimide.

Synthesis Example 5: Synthesis of Alkali-Soluble Resin (A-4)

The same procedure as in Synthesis Example 3 was carried out, except that N,N-dimethylformamide dimethyl acetal was used in an amount of 33.4 g (0.28 mole), thereby producing an alkali-soluble resin (A-4) that was a polyimide.

Synthesis Example 6: Synthesis of Alkali-Soluble Resin (A-5)

The same procedure as in Synthesis Example 3 was carried out, except that N,N-dimethylformamide dimethyl acetal was used in an amount of 17.9 g (0.15 mole), thereby producing an alkali-soluble resin (A-5) that was a polyimide.

Synthesis Example 7: Synthesis of Alkali-Soluble Resin (A-6)

The same procedure as in Synthesis Example 3 was carried out, except that N,N-dimethylformamide dimethyl acetal was used in an amount of 11.9 g (0.10 mole), thereby producing an alkali-soluble resin (A-6) that was a polyimide.

Synthesis Example 8: Synthesis of Alkali-Soluble Resin (A-7)

Under a dried nitrogen stream, ODPA (31.0 g (0.10 mole)), 2-butanol (74.1 g (1.0 mole)) and triethylamine (0.51 g (0.05 mole)) were introduced, and the resultant mixture was stirred at 80° C. for 5 hours to cause the reaction among these components. An excessive portion of 2-butanol was distilled away by reducing the pressure to produce 3,3',4,4'-diphenyl ether tetracarboxylic acid di-sec-butyl ester. Subsequently, thionyl chloride (21.41 g) and toluene (80.0 g) were introduced into a flask, the resultant mixture was reacted at 40° C. for 3 hours, and then toluene was distilled away by reducing the pressure. NMP (150 g) was added to the resultant product to produce a solution of 3,3',4,4'-diphenyl ether tetracarboxylic acid di-sec-butyl ester dichloride.

Subsequently, under a dried nitrogen stream, NMP (150 g), 2,2-bis(3-amino-4-hydroxyphenyl)hexafluoropropane (29.30 g (0.08 mole)), 3,5-diaminobenzoic acid (1.52 g (0.01 mole)) and 4-aminophenol (2.18 g (0.02 mole)) were introduced, then these components were dissolved-together while stirring, then pyridine (28.48 g) was added to the resultant solution, then a solution of 3,3',4,4'-diphenyl ether tetracarboxylic acid di-sec-butyl ester dichloride was added dropwise over 1 hour while keeping the temperature at 0 to 5° C., and the resultant solution was further stirred for 2 hours after the dropwise addition. After the completion of the stirring, the solution was introduced into water (3 L) to produce white precipitates. The precipitates were collected by filtration, then washed with water three times, and then dried with a vacuum dryer at 80° C. for 24 hours to produce an alkali-soluble resin (A-7) that was a polyimide precursor.

Synthesis Example 9: Synthesis of Quinone Diazide Compound (B-1)

Under a dried nitrogen stream, TrisP-PA (a product name, manufactured by Honshu Kagaku Industry Co., Ltd.) (21.22 g (0.05 mole)) and 5-naphthoquinone diazide sulfonic acid chloride (36.27 g (0.135 mole)) were dissolved in 1,4-dioxane (450 g) and the temperature of the resultant solution was restored to room temperature. To this solution was added dropwise a mixture of 1,4-dioxane (50 g) and triethylamine (15.18 g) while avoiding the increase in temperature of the inside of the system to 35° C. or higher. After the dropwise addition, the resultant mixture was stirred at 30° C. for 2 hours. A triethylamine salt was filtered out from the solution, and a filtrate was introduced into water. Subsequently, precipitates were collected by filtration. The precipitates were dried with a vacuum dryer to produce a quinone diazide compound (B-1) represented by the following formula.

[chemical formula 8]

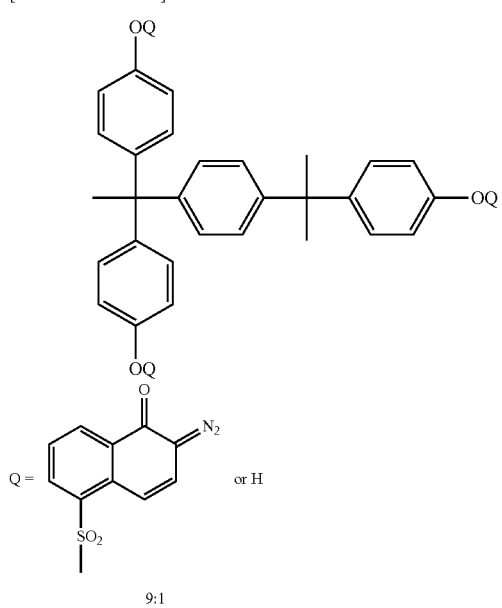

Synthesis Example 10: Synthesis of Quinone Diazide Compound (B-2)

The same procedure as in Synthesis Example 9 was carried out, except that 5-naphthoquinone diazide sulfonic acid chloride was used in an amount of 28.14 g (0.105 mole), thereby producing a quinone diazide compound (B-2).

Reference Example 1

The alkali-soluble resins (A-1) (10.0 g) synthesized in the Synthesis Example 2 above and the compound (B-1) (1.2 g) were dissolved in propylene glycol monomethyl ether (also referred to as "PGME", hereinafter) (32.0 g) and γ-butyrolactone (also referred to as "GBL", hereinafter) (8.0 g), and the resultant solution was filtrated through a 0.2-μm polytetrafluoroethylene-made filter (Sumitomo Electric Industries, Ltd.) to produce a photosensitive resin composition (varnish) A.

Reference Examples 2 to 8

Varnishes B to H were produced in the same manner as in Reference Example 1 using the compounds of which the types and amounts are shown in Table 3.

Examples 1 to 10, Comparative Examples 1 to 6

Organic EL display devices were produced in the same manner as mentioned above in the section <production of organic EL display device> using the photosensitive resin composition (varnishes) shown in Table 3 as insulating layers. Example 9 was the same as Example 1, except that a bleaching treatment at 1000 mJ/cm² was additionally carried out after the exposure to light. In each of Examples 5 to 8 and Comparative Examples 4 to 6, the opening sections each having a width of 50 μm and a length of 260 μm were changed to opening sections each having a width of 70 μm and a length of 260 μm and the insulating layer opening ratio was changed to 25%. Using each of the organic EL display devices, the long-term reliability test for an organic EL display device was carried out by the method mentioned in the section <Evaluation of long-term reliability>. The results of the evaluation are shown in Table 4.

TABLE 3

| Photosensitive resin composition | (A) Alkali-soluble resin having carboxylic acid structure | (B) Photosensitizing agent | (C) Organic solvent |
|---|---|---|---|
| Reference Example 1 | A | A-1 10.0 g | B-1 1.2 g | PGME/GBL 32.0 g/8.0 g |
| Reference Example 2 | B | A-2 10.0 g | B-1 1.2 g | PGME/GBL 32.0 g/8.0 g |
| Reference Example 3 | C | A-3 10.0 g | B-2 1.2 g | PGME/GBL 32.0 g/8.0 g |
| Reference Example 4 | D | A-4 10.0 g | B-1 1.2 g | PGME/GBL 32.0 g/8.0 g |
| Reference Example 5 | E | A-3 10.0 g | B-1 1.2 g | PGME/GBL 32.0 g/8.0 g |
| Reference Example 6 | F | A-5 10.0 g | B-1 1.2 g | PGME/GBL 32.0 g/8.0 g |
| Reference Example 7 | G | A-6 10.0 g | B-1 1.2 g | PGME/GBL 32.0 g/8.0 g |
| Reference Example 8 | H | A-7 10.0 g | B-1 1.2 g | PGME/GBL 32.0 g/8.0 g |

TABLE 4

| | Insulating layer Photosensitive resin composition | Photosensitizing properties Sensitivity | Residual amount of acid anhydrides In terms of aromatic ring | Absorption intensity meASured by FT-IR and index (a) | | | Long-term reliability of organic EL device Pixel luminescence area ratio [%] | | |
|---|---|---|---|---|---|---|---|---|---|
| | | | | Intensity at 1853 cm⁻¹ | Intensity at 1436 cm⁻¹ | Index (a) | 250 hr | 500 hr | 1000 hr |
| Comparative Example 1 | A | 500 mJ/cm² | 0.001 | 0.00005 | 0.0572 | 0.001 | 100 | 99 | 97 |
| Example 1 | B | 150 mJ/cm² | 0.022 | 0.0011 | 0.0496 | 0.022 | 100 | 97 | 95 |

TABLE 4-continued

| | Insulating layer Photosensitive resin composition | Photosensitizing properties Sensitivity | Residual amount of acid anhydrides In terms of aromatic ring | Absorption intensity meASured by FT-IR and index (a) | | | Long-term reliability of organic EL device Pixel luminescence area ratio [%] | | |
|---|---|---|---|---|---|---|---|---|---|
| | | | | Intensity at 1853 cm$^{-1}$ | Intensity at 1436 cm$^{-1}$ | Index (a) | 250 hr | 500 hr | 1000 hr |
| Example 2 | C | 147 mJ/cm$^2$ | 0.026 | 0.0011 | 0.0418 | 0.026 | 99 | 95 | 91 |
| Example 3 | D | 145 mJ/cm$^2$ | 0.032 | 0.0014 | 0.0435 | 0.032 | 96 | 92 | 88 |
| Example 4 | E | 140 mJ/cm$^2$ | 0.038 | 0.0015 | 0.0392 | 0.038 | 93 | 88 | 80 |
| Comparative Example 2 | F | 130 mJ/cm$^2$ | 0.061 | 0.0030 | 0.0491 | 0.061 | 90 | 70 | 30 |
| Comparative Example 3 | G | 120 mJ/cm$^2$ | 0.084 | 0.0043 | 0.0513 | 0.084 | 81 | 49 | 0 |
| Comparative Example 4 | A | 500 mJ/cm$^2$ | 0.001 | 0.00004 | 0.0556 | 0.001 | 100 | 99 | 99 |
| Example 5 | B | 150 mJ/cm$^2$ | 0.023 | 0.0012 | 0.0528 | 0.023 | 100 | 98 | 97 |
| Example 6 | C | 147 mJ/cm$^2$ | 0.026 | 0.0013 | 0.0495 | 0.026 | 99 | 97 | 95 |
| Example 7 | D | 145 mJ/cm$^2$ | 0.030 | 0.0013 | 0.0435 | 0.030 | 96 | 94 | 93 |
| Example 8 | E | 140 mJ/cm$^2$ | 0.039 | 0.0014 | 0.0355 | 0.039 | 94 | 90 | 85 |
| Comparative Example 5 | F | 130 mJ/cm$^2$ | 0.059 | 0.0028 | 0.0477 | 0.059 | 91 | 79 | 62 |
| Comparative Example 6 | G | 120 mJ/cm$^2$ | 0.076 | 0.0041 | 0.0539 | 0.076 | 85 | 68 | 39 |
| Example 9 | B | 150 mJ/cm$^2$ | 0.005 | 0.0002 | 0.0421 | 0.005 | 100 | 99 | 97 |
| Example 10 | H | 175 mJ/cm$^2$ | 0.023 | 0.0011 | 0.0488 | 0.023 | 98 | 94 | 89 |

Synthesis Example 11: Synthesis of Compound Having Naphthoquinone Diazide Structure (QD-1)

Under a dried nitrogen stream, TrisP-PA (21.23 g (0.05 mol)) and 5-naphthoquinone diazide sulfonic acid chloride (37.62 g (0.14 mol)) were weighed in a three-necked flask and were dissolved in 1,4-dioxane (450 g) in a three-necked flask and the resultant solution was allowed to leave to room temperature. To this solution was dropwise added a mixed solution of 1,4-dioxane (50 g) and triethylamine (15.58 g (0.154 mol)) while stirring and avoiding the increase in the temperature of the inside of the system to 35° C. or higher. After the dropwise addition, the mixed solution was stirred at 30° C. for 2 hours. After the stirring, the precipitated triethylamine salt was removed by filtration, then a filtrate was introduced into water, then the resultant solution was stirred, and then solid precipitates were collected by filtration. The solid material was dried by reduced-pressure drying to produce a compound (QD-1) which had a naphthoquinone diazide structure represented by the following formula.

[chemical formula 9]

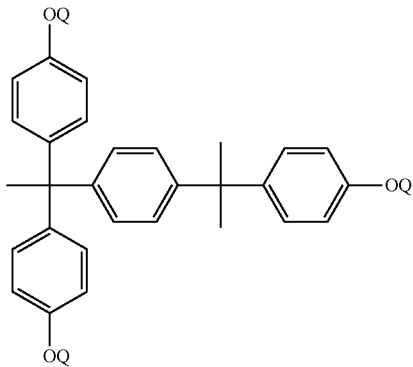

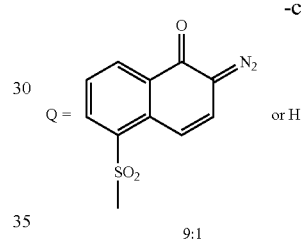

9:1

Synthesis Example 12: Synthesis of Polyimide (PI-1)

Under a dried nitrogen stream, BAHF (31.13 g (0.085 mol; 77.3 mol % relative to the amount of structural units derived from all of amines and derivatives thereof)), SiDA (6.21 g (0.0050 mol; 4.5 mol % relative to the amount of structural units derived from all of amines and derivatives thereof)), MAP (2.18 g (0.020 mol; 9.5 mol % relative to the amount of structural units derived from all of amines and derivatives thereof)) that served as an end-capping agent and NMP (150.00 g) were weighed in a three-necked flask and were dissolved together. To this solution was added a solution prepared by dissolving ODPA (31.02 g (0.10 mol; 100 mol % relative to the amount of structural units derived from all of carboxylic acids and derivatives thereof)) in NMP (50.00 g). The resultant solution was stirred qt 20° C. for 1 hour, and was then further stirred at 50° C. for 4 hours. Subsequently, xylene (15 g) was added to the solution, and the resultant solution was stirred at 150° C. for 5 hours while azeotropically distilling water together with xylene. After the completion of the reaction, the reaction solution was introduced into water (3 L), and solid precipitates were collected by filtration. The solid material was washed with water three times and was then dried with a vacuum dryer at 80° C. for 24 hours to produce a polyimide (PI-1).

Synthesis Example 13: Synthesis of Polyimide Precursor (PIP-1)

Under a dried nitrogen stream, ODPA (31.02 g (0.10 mol; 100 mol % relative to the amount of structural units derived from all of carboxylic acids and derivatives thereof)) and NMP (150 g) were weighed in a three-necked flask and were dissolved together. To the resultant solution was added a solution prepared by dissolving BAHF (25.64 g (0.070 mol; 56.0 mol % relative to the amount of structural units derived from all of amines and derivatives thereof)) and SiDA (6.21 g (0.0050 mol; 4.0 mol % relative to the amount of structural units derived from all of amines and derivatives thereof)) in NMP (50 g). The resultant solution was stirred at 20° C. for 1 hour, and was then further stirred at 50° C. for 2 hours. Subsequently, a solution prepared by dissolving MAP (5.46 g (0.050 mol; 40.0 mol % relative to the amount of structural units derived from all of amines and derivatives thereof) that served as an end-capping agent in NMP (15 g) was added thereto, and the resultant solution was stirred at 50° C. for 2 hours. Subsequently, a solution prepared by dissolving DFA (23.83 g (0.20 mol)) in NMP (15 g) was added dropwise to the solution over 10 minutes. After the dropwise addition, the solution was stirred at 50° C. for 3 hours. After the completion of the reaction, the reaction solution was cooled to room temperature, and then the reaction solution was introduced into water (3 L), and solid precipitates were collected by filtration. The solid material was washed with water three times, and was then dried with a vacuum dryer at 80° C. for 24 hours to produce a polyimide precursor (PIP-1).

Synthesis Example 14: Synthesis of Polybenzoxazole Precursor (PBOP-1)

BAHF (34.79 g (0.095 mol; 95.0 mol % relative to the amount of structural units derived from all of amines and derivatives thereof)), SiDA (1.24 g (0.0050 mol; 5.0 mol % relative to the amount of structural units derived from all of amines and derivatives thereof)) and NMP (70.00 g) were weighed in a 500-mL round-bottom flask equipped with a Dean-Stark water separator and a condenser tube and having toluene filled therein, and then dissolved together. To the resultant solution was added a solution prepared by dissolving BFE (19.06 g (0.080 mol; 66.7 mol % relative to the amount of structural units derived from all of carboxylic acids and derivatives thereof)) in NMP (20.00 g). The resultant solution was stirred at 20° C. for 1 hour and then further stirred at 50° C. for 2 hours. Subsequently, a solution prepared by dissolving NA (6.57 g (0.040 mol; 33.3 mol % relative to the amount of structural units derived from all of carboxylic acids and derivatives thereof 33.3 mol %) that served as an end-capping agent in NMP (10 g) was added to the solution, and the resultant solution was stirred at 50° C. for 2 hours. Subsequently, the solution was stirred at 100° C. for 2 hours under a nitrogen atmosphere. After the completion of the reaction, the reaction solution was introduced into water (3 L), and solid precipitates were collected by filtration. The solid material was washed with water three times, then dried with a vacuum dryer at 80° C. for 24 hours, then washed with water three times and then dried with a vacuum dryer at 80° C. for 24 hours to produce a polybenzoxazole precursor (PBOP-1).

Synthesis Example 15: Synthesis of Polysiloxane Solution (PS-1)

MeTMS (28.95 g (42.5 mol %)), PhTMS (49.57 g (50 mol %)) and PGMEA (74.01 g) were introduced in a three-necked flask. Air was allowed to flow in the flask at 0.05 L/min., and the mixed solution was heated to 40° C. in an oil bath while stirring. An aqueous phosphoric acid solution prepared by dissolving phosphoric acid (0.442 g) in water (27.71 g) was added dropwise to the mixed solution over 10 minutes while further stirring the mixed solution. After the dropwise addition, the solution was stirred at 40° C. for 30 minutes to cause a silane compound to be hydrolyzed. After the completion of the hydrolysis, a solution prepared by dissolving TMSSucA (9.84 g (7.5 mol %)) in PGMEA (8.22 g) was added to the solution. Subsequently, the resultant solution was stirred at a bath temperature of 70° C. for 1 hour, and then the bath temperature was raised to 115° C. About 1 hour after the initiation of the temperature raising, the internal temperature of the solution reached 100° C., and the solution was stirred while heating for 2 hours thereafter (the internal temperature was 100 to 110° C.). A resin solution produced as the result of the 2-hours stirring while heating was cooled on an ice bath, and then an anion exchange resin and a cation exchange resin were added each in an amount of 2% by weight to the resin solution, and then the resultant mixture was stirred for 12 hours. After the stirring, the anion exchange resin and the cation exchange resin were removed by filtration to produce a polysiloxane solution (PS-1). The polysiloxane thus produced had a Mw of 4,000 and a carboxylic acid equivalent of 910.

Synthesis Example 16: Synthesis of Cardo-Type Resin (CD-1)

BHPF (35.04 g (0.10 mol)) and MBA (40.31 g) were weighed in a three-necked flask, and were dissolved together. To the mixture was added a solution prepared by dissolving ODPA (27.92 g (0.090 mol)) and PHA (2.96 g (0.020 mol)) that served as an end-capping agent in MBA (30.00 g) was added. The resultant solution was stirred at 20° C. for 1 hour. Subsequently, the solution was stirred at 150° C. for 5 hours under a nitrogen atmosphere. After the completion of the reaction, a solution prepared by dissolving GMA (14.22 g (0.10 mol)), DBA (0.135 g (0.0010 mol)) and 4-MOP (0.037 g (0.0003 mol)) in MBA (10.00 g) was added to the reaction solution, and the resultant solution was stirred at 90° C. for 4 hours to produce a cardo-type resin solution (CD-1). The cardo-type resin thus produced had a Mw of 4,000, a carboxylic acid equivalent of 800 and a double bond equivalent of 800.

Synthesis Example 17: Synthesis of Acrylic Resin Solution (AC-1)

AIBN (0.821 g (1 mol %)) and PGMEA (29.29 g) were introduced into a three-necked flask. Subsequently, MAA (21.52 g (50 mol %)), TCDM (22.03 g 120 mol %)) and STR (15.62 g (30 mol %)) were introduced into the flask, then the mixture was stirred at room temperature for a while to sufficiently purge the inside of the flask with nitrogen by bubbling, and then the solution was stirred at 70° C. for 5 hours. Subsequently, a solution prepared by dissolving GMA (14.22 g (20 mol %)), DBA (0.676 g (1 mol %)) and 4-MOP (0.186 g (0.3 mol %)) in PGMEA (59.47 g) was added to the reaction solution, and then the resultant solution was stirred at 90° C. for 4 hours to produce an acrylic resin solution (AC-1). The acrylic resin thus produced had a Mw of 15,000, a carboxylic acid equivalent of 490 and a double bond equivalent of 730.

The compositions employed in Synthesis Examples 12 to 17 are shown in Tables 5 to 9.

TABLE 5

| Polymer | Monomer [molar ratio] | | | |
|---|---|---|---|---|
| | Tetracarboxylic acid and derivative thereof | Diamine and derivative thereof | | End capping agen |
| Synthesis Example 12 | Polyimide (PI-1) | ODPA (100) | BAHF (85) | SiDA (5) | MAP (20) |
| Synthesis Example 13 | Polyimide precursor (PIP-1) | 6FDA (100) | BAHF (70) | SiDA (5) | MAP (50) |

TABLE 6

| Polymer | Monomer [molar ratio] | | | |
|---|---|---|---|---|
| | Dicarboxylic acid and derivative thereof Diformyl compound and derivative thereof | | Bisaminophenol compound and derivative thereof Dihydroxydiamine and derivative thereof | |
| Synthesis Example 14 | Polybenzoxazole precursor (PBOP-1) | BFE (80) | NA (40) | BAHF (95) | SiDA (5) |

TABLE 7

| Polymer | Monomer [mol %] Trifunctional organosilane | | |
|---|---|---|---|
| Synthesis Example 15 | Polysiloxane solution (PS-1) | MeTMS (45) | PhTMS (50) | TMSSucA (5) |

TABLE 8

| Polymer | Monomer [molar ratio] | | | |
|---|---|---|---|---|
| | Compound having at least two aromatic groups and hydroxy group | Tetracarboxylic dianhydride Tetracarboxylic acid | End capping agent | Unsaturated compound having ethylenical double bond group and epoxy group |
| Synthesis Example 16 | Cardo resin (CD-1) | BHPF (100) | ODPA (90) | PHA (20) | GMA (100) |

TABLE 9

| Polymer | Monomer [molar ratio] | | | |
|---|---|---|---|---|
| | Copolymerization component having acidic group | Copolymerization component having aromatic group | Copolymerization component having alicyclic group | Unsaturated compound having ethylenical double bond group and epoxy group |
| Synthesis Example 17 | Acrylic resin solution (AC-1) | MAA (50) | STR (30) | TCDM (20) | GMA (20) |

Preparation Example 1: Preparation of Pigment Dispersion (Bk-1)

A 30-wt % solution (138.0 g) of polyimide (PI-1) produced in Synthesis Example 1, which was a resin, in MBA, S-20000 (13.8 g) which was a dispersant and MBA (685.4 g) which was a solvent and Bk-S0100CF (82.8 g) which was a coloring agent were weighed and mixed together, and then the resultant mixture was stirred for 20 minutes with a high-speed disperser (HOMOGENIZING DISPER Model 2.5; manufactured by PRIMIX Corporation) to produce a preparatory dispersion. The preparatory dispersion was supplied to Ultra Apex Mill (UAM-015; manufactured by Kotobuki Kogyou Co., Ltd.) equipped with a centrifugal separator filled with 0.30-mmφ zirconia milling balls (YTZ; manufactured by Tosoh Corporation) that served as ceramic beads for pigment dispersion use at a filling ratio of 75%, and the preparatory dispersion was treated for 3 hours at a rotor peripheral speed of 7.0 m/s to produce a pigment dispersion (Bk-1) having a solid concentration of 15% by weight and a (coloring agent)/resin/dispersant ratio of 60/30/10 (by weight). The number average particle diameter of the pigment contained in the pigment dispersion was 100 nm.

Preparation Examples 2 to 7: Preparation of Pigment Dispersions (Bk-2) to (Bk-7)

Pigment dispersions (Bk-2) to (Bk-7) were prepared by the pigment dispersion process at compounding ratios shown in Table 10 in the same manner as in Preparation Example 1.

The compositions of Preparation Examples 1 to 7 are shown in Table 10.

TABLE 10

| | | Composition [wt %] | | |
|---|---|---|---|---|
| | Dispersion | (F) Coloring material | (A) Alkali-soluble resin having carboxylic acid structure | (G) Dispersant |
| Preparation Example 1 | Pigment dispersion (Bk-1) | Bk-S0100CF (60) | Polyimide (PI-1) (30) | S-20000 (10) |
| Preparation Example 2 | Pigment dispersion (Bk-2) | Bk-S0100CF (60) | Polyimide precursor (PIP-1) (20) | S-20000 (20) |
| Preparation Example 3 | Pigment dispersion (Bk-3) | Bk-S0100CF (60) | Polybenzoxazole precursor (PBPO-1) (20) | S-20000 (20) |
| Preparation Example 4 | Pigment dispersion (Bk-4) | Bk-S0100CF (60) | Polysiloxane (PS-1) (20) | S-20000 (20) |
| Preparation Example 5 | Pigmen dispersion (Bk-5) | Bk-S0100CF (60) | Cardo resin (CD-I) (20) | S-20000 (20) |
| Preparation Example 6 | Pigment dispersion (Bk-6) | Bk-S0100CF (60) | Acrylic resin (AC-1) (20) | S-20000 (20) |
| Preparation Example 7 | Pigmen dispersion (Bk-7) | TPK-1227 (60) | Polyimide (PI-1) (20) | D.BYK-167 (20) |

Example 11

NCI-831 (0.256 g) was weighed, then MBA (10.186 g) was added thereto, and then the resultant mixture was stirred to dissolve together under a yellow lamp. Subsequently, a 30-wt % solution (0.300 g) of the polyimide (PI-1) produced in Synthesis Example 12 in MBA, a 30-wt % solution (2.275 g) of the polyimide precursor (PIP-1) produced in Synthesis Example 13 in MBA and an 80-wt % solution (1.422 g) of DPHA in MBA were added to the above-prepared solution, and the resultant solution was stirred to produce a preparation that was a homogeneous solution. Subsequently, the pigment dispersion (Bk-1) (12.968 g) produced in Preparation Example 1 was weighed, then the above-prepared preparation (12.032 g) was added thereto, and then the resultant solution was stirred to produce a homogeneous solution. Subsequently, the solution was filtrated through a 0.45-μmφ filter to prepare a photosensitive resin composition 1. An organic EL display device was manufactured in the same manner as mentioned in the section <Manufacture of organic EL display device> using the above-produced photosensitive resin composition 1 for an insulating layer. Using the organic EL display device, the long-term reliability test was carried out by the method mentioned in the section <Evaluation of long-term reliability>. The results of the evaluation are shown in Table 13.

Examples 12 to 19 and Comparative Examples 7 to 11

Photosensitive resin compositions 2 to 14 were prepared in the same manner as in Example 11 employing the compositions shown in Tables 11 and 12. Organic EL display devices were manufactured in the same manner as mentioned in the section <Manufacture of organic EL display device> using the photosensitive resin compositions (varnishes) shown in Tables 11 and 12 for insulating layers, respectively. Using the organic EL display devices, the long-term reliability test was carried out by the method mentioned in the section <Evaluation of long-term reliability>. The results of the evaluation are shown in Table 13.

TABLE 11

| | Photosensitive resin composition | Pigment dispersion | (A) Alkali-soluble resin having carboxylic acid structure | | | | (E) Radically polymerizable monomer |
|---|---|---|---|---|---|---|---|
| | | | First resin derived from pigment dispersion | First resin derived from preparation to be added to pigment dispersion | Second resin derived from pigment dispersion | Second resin derived from preparation to be added to pigment dispersion | |
| Example 11 | 1 | Bk-1 | PI-1 (26.3) | PI-1 (21.7) | — | PIP-1 (12) | DPHA (40) |
| Example 12 | 2 | Bk-2 | — | PI-1 (24) | PIP-1 (19.2) | PIP-1 (16.8) | DPHA (40) |
| Example 13 | 3 | Bk-2 | — | PI-1 (18) | PIP-1 (19.2) | PIP-1 (22.8) | DPHA (40) |
| Example 14 | 4 | Bk-1 | PI-1 (26.3) | PI-1 (15.7) | — | PIP-1 (28) | DPHA (30) |
| Example 15 | 5 | Bk-3 | — | PI-1 (30) | PBOP-1 (19.2) | PBP-1 (10.8) | DPHA (40) |
| Example 16 | 6 | Bk-4 | — | PI-1 (30) | PS-1 (19.2) | PS-1 (10.8) | DPHA (40) |
| Example 17 | 7 | Bk-5 | — | PI-1 (30) | CD-1 (19.2) | CD-1 (10.8) | DPHA (40) |
| Example 18 | 8 | Bk-6 | — | PI-1 (30) | AC-1 (19.2) | AC-1 (10.8) | DPHA (40) |
| Example 19 | 9 | Bk-7 | PI-1 (19.2) | PI-1 (10.8) | — | PIP-1 (30) | DPHA (40) |

| | (B) Photosensitizing agent | (F) Coloring material derived from pigment dispersion | (G) Dispersant derived from pigment dispersion | (F) Coloring material derived from preparation to be added to pigment dispersion | Sensitizer | Chain transfer agent | Solvent |
|---|---|---|---|---|---|---|---|
| Example 11 | NCI-831 (9) | Bk-S0100CF (52.7) | S-20000 (8.8) | — | — | — | MBA |
| Example 12 | NCI-831 (9) | Bk-S0100CF (57.5) | S-20000 (19.2) | — | — | — | MBA |
| Example 13 | NCI-831 (9) | Bk-S0100CF (57.5) | S-20000 (19.2) | — | — | — | MBA |
| Example 14 | NCI-831 (9) | Bk-S0100CF (52.7) | S-20000 (8.8) | — | — | — | MBA |
| Example 15 | NCI-831 (9) | Bk-S0100CF (57.5) | S-20000 (19.2) | — | — | — | MBA |
| Example 16 | NCI-831 (9) | Bk-S0100CF (57.5) | S-20000 (19.2) | — | — | — | MBA |
| Example 17 | NCI-831 (9) | Bk-S0100CF (57.5) | S-20000 (19.2) | — | — | — | MBA |
| Example 18 | NCI-831 (9) | Bk-S0100CF (57.5) | S-20000 (19.2) | — | — | — | MBA |
| Example 19 | NCI-831 (9) | TPK-1227 (57.5) | D.BYK-167 (19-2) | — | — | — | MBA |

TABLE 12

| | Photosensitive resin composition | Pigment dispersion | (A) Alkali-soluble resin having carboxylic acid structure | | | | (E) Radically polymerizable monomer |
|---|---|---|---|---|---|---|---|
| | | | First resin derived from pigment dispersion | First resin derived from preparation to be added to pigment dispersion | Second resin derived from pigment dispersion | Second resin derived from preparation to be added to pigment dispersion | |
| Comparative Example 7 | 10 | Bk-1 | PI-1 (26.3) | PI-1 (33.7) | — | — | DPHA (40) |
| Comparative Example 8 | 11 | Bk-2 | — | PI-1 (12) | PIP-1 (19.2) | PIP-1 (28.8) | DPHA (40) |

TABLE 12-continued

| | | | | | | | |
|---|---|---|---|---|---|---|---|
| Comparative Example 9 | 12 | Bk-5 | — | — | CD-1 (19.2) | CD-1 (40.8) | DPHA (40) |
| Comparative Example 10 | 13 | Bk-6 | — | — | AC-1 (19.2) | AC-1 (40.8) | DPHA (40) |
| Comparative Example 11 | 14 | Bk-1 | PI-1 (30) | PI-1 (20) | — | PIP-1 (50) | — |

Composition [wt %]

| | (B) Photosensitizing agent | (F) Coloring material derived from pigment dispersion | (G) Dispersant derived from pigment dispersion | (F) Coloring material derived from preparation to be added to pigment dispersion | Compound having naphthoquinone diazide structure | Dissolution accelerator | Solvent |
|---|---|---|---|---|---|---|---|
| Comparative Example 7 | NCI-831 (9) | Bk-S0100CF (52.7) | S-20000 (8.8) | — | — | — | MBA |
| Comparative Example 8 | NCI-831 (9) | Bk-S0100CF (57.5) | S-20000 (19.2) | — | — | — | MBA |
| Comparative Example 9 | NCI-831 (9) | Bk-S0100CF (57.5) | S-20000 (19.2) | — | — | — | MBA |
| Comparative Example 10 | NCI-831 (9) | Bk-S0100CF (57.5) | S-20000 (19.2) | — | — | — | MBA |
| Comparative Example 11 | — | Bk-S0100CF (60) | S-20000 (10) | — | QD-1 (20) | TrisP-PA (10) | MBA |

TABLE 13

| | Insulating layer Photosensitive resin composition | Photosensitizing properties Sensitivity | Residual amount of acid anhydrides In terms of aromatic ring | Absorption intensity measured by FT-IR and index (a) | | | Long-term reliability of organic EL device Pixel luminescence area ratio [%] | | |
|---|---|---|---|---|---|---|---|---|---|
| | | | | Intensity at 1853 cm$^{-1}$ | Intensity at 1436 cm$^{-1}$ | Index (a) | 250 hr | 500 hr | 1000 hr |
| Example 11 | 1 | 55 mJ/cm$^2$ | 0.009 | 0.0005 | 0.0552 | 0.009 | 100 | 99 | 99 |
| Example 12 | 2 | 50 mJ/cm$^2$ | 0.011 | 0.0006 | 0.0527 | 0.011 | 100 | 97 | 97 |
| Example 13 | 3 | 45 mJ/cm$^2$ | 0.023 | 0.0010 | 0.0430 | 0.023 | 99 | 94 | 91 |
| Example 14 | 4 | 50 mJ/cm$^2$ | 0.016 | 0.0007 | 0.0425 | 0.016 | 99 | 99 | 95 |
| Example 15 | 5 | 50 mJ/cm$^2$ | 0.036 | 0.0015 | 0.0416 | 0.036 | 93 | 86 | 81 |
| Example 16 | 6 | 50 mJ/cm$^2$ | 0.029 | 0.0014 | 0.0483 | 0.029 | 94 | 90 | 85 |
| Example 17 | 7 | 45 mJ/cm$^2$ | 0.028 | 0.0014 | 0.0501 | 0.028 | 92 | 88 | 87 |
| Example 18 | 8 | 40 mJ/cm$^2$ | 0.029 | 0.0017 | 0.0580 | 0.029 | 96 | 94 | 90 |
| Example 19 | 9 | 60 mJ/cm$^2$ | 0.034 | 0.0016 | 0.0467 | 0.034 | 98 | 90 | 82 |
| Comparative Example 7 | 10 | 60 mJ/cm$^2$ | 0.062 | 0.0030 | 0.0486 | 0.062 | 81 | 58 | 30 |
| Comparative Example 8 | 11 | 40 mJ/cm$^2$ | 0.057 | 0.0026 | 0.0457 | 0.057 | 85 | 69 | 42 |
| Comparative Example 9 | 12 | 45 mJ/cm$^2$ | 0.046 | 0.0018 | 0.0391 | 0.046 | 85 | 70 | 50 |
| Comparative Example 10 | 13 | 40 mJ/cm$^2$ | 0.050 | 0.0022 | 0.0440 | 0.050 | 80 | 70 | 48 |
| Comparative Example 11 | 14 | 800 mJ/cm$^2$ | 0.059 | 0.0030 | 0.0507 | 0.059 | 80 | 60 | 40 |

[Description of Abbreviated Names of Compounds]
4,4'-DAE: 4,4'-diamino diphenyl ether
4-MOP: 4-methoxyphenol
6FDA: 2,2-(3,4-dicarboxyphenyl)hexafluoropropane dianhydride; 4,4'-hexafluoropropan-2,2-diyl-bis(1,2-phthalic anhydride)
6FDAc: 2,2-(3,4-dicarboxyphenyl)hexafluoropropane; 4,4'-hexafluoropropan-2,2-diyl-bis(1,2-phthalic acid)
AcrTMS: 3-acryloyloxypropyltrimethoxysilane
AIBN: 2,2'-azobis(isobutyronitrile)
BAHF: 2,2-bis(3-amino-4-hydroxyphenyl)hexafluoropropane
BAPF: 9,9-bis(3-amino-4-hydroxyphenyl)fluorene
BFE: 1,2-bis(4-formylphenyl)ethane
BGEF: 9,9-bis[4-(2-glycidoxyethoxy)phenyl]fluorene
BGPF: 9,9-bis(4-glycidoxyphenyl)fluorene
BHEF: 9,9-bis[4-(2-hydroxyethoxy)phenyl]fluorene
BHPF: 9,9-bis(4-hydroxyphenyl)fluorene
Bis-A-AF: 2,2-bis(4-aminophenyl)hexafluoropropane
Bk-S0084: "PALIOGEN" (a registered trademark) BLACK S0084 (manufactured by BASF; a perylene-type black pigment having a primary particle diameter of 50 to 100 nm)
Bk-S0100CF: "IRGAPHOR" (a registered trademark) BLACK S0100CF (manufactured by BASF; a benzofuranone-type black pigment having a primary particle diameter of 40 to 80 nm)
Bk-TH-807: "NUBIAN" (a registered trademark) BLACK TH-807 (manufactured by Orient Chemical Industries, Co., Ltd.; an azine-type black dye)

BnMA: benzyl methacrylate
BSAA: 2,2'-bis[4-(3,4-dicarboxyphenoxy)phenyl]propane dianhydride
BZAc: benzoic acid
cyEpoTMS: 2-(3,4-epoxycyclohexyl)ethyltrimethoxysilane
DBA: dibenzylamine
D.BYK-167: "DISPERBYK" (a registered trademark)-167 (manufactured by BYK Chemie Ltd. Japan; a dispersant having an amine value)
D.Y.201: C. I. Disperse Yellow 201
DETX-S: "KAYACURE" (a registered trademark) DETX-S (manufactured by Nippon Kayaku Co., Ltd.; 2,4-diethylthioxanthone)
DFA: N,N-dimethylformamide dimethyl acetal
DMeDMS: dimethyldimethoxysilane
DMF: N,N-dimethylformamide
DPHA: "KAYARAD" (a registered trademark) DPHA (manufactured by Nippon Kayaku Co., Ltd.; dipentaerythritol hexaacrylate)
ED-900: "JEFFAMINE" (a registered trademark) ED-900 (manufactured by HUNTSMAN Corporation; a diamine having an oxyalkylene structure)
GMA: glycidyl methacrylate
HCl: hydrochloric acid
HFHA: N,N'-bis[5,5'-hexafluoropropan-2,2-diyl-bis(2-hydroxyphenyl)]bis(3-aminobenzoic acid amide)
ICl: iodine monochloride
IGZO: indium gallium zinc oxide
ITO: indium tin oxide
KOH: potassium hydroxide
KI: potassium iodide
MAA: methacrylic acid
MAP: 3-aminophenol; methaminophenol
MBA: 3-methoxy-n-butyl acetate
MeTMS: methyltrimethoxysilane
MgAg: magnesium silver
MT-PE1: "Karenz MT"-PE1 (manufactured by Showa Denko K. K.; pentaerythritol tetrakis (3-mercaptobutyrate))
NA: 5-norbornene-2,3-dicarboxylic anhydride; nadic anhydride
NapTMS: 1-naphthyltrimethoxysilane
$Na_2S_2O_3$: sodium thiosulfate
NMP: N-methyl-2-pyrrolidone
ODPA: bis(3,4-dicarboxyphenyl)ether dianhydride; oxydiphthalic dianhydride
ODPAc: bis(3,4-dicarboxyphenyl)ether; oxydiphthalic acid
P.B.15:6: C. I. Pigment Blue 15:6
P.R.254: C. I. Pigment Red 254
P.Y.139: C. I. Pigment Yellow 139
PA-5600: "NUBIAN" (a registered trademark) BLUE PA-5600 (manufactured by Orient Chemical Industries, Co., Ltd.; a blue dye)
PET: polyethylene terephthalate
PGDA: propylene glycol diacetate
PGMEA: propylene glycol monomethyl ether acetate
PHA: phthalic anhydride
PhTMS: phenyltrimethoxysilane
PI: polyimide
S-20000: "SOLSPERSE" (a registered trademark) 20000 (manufactured by Lubrizol Corporation; a polyether-type dispersant)
SiDA: 1,3-bis(3-aminopropyl)tetramethyldisiloxane
S.B.63: C. I. Solvent Blue 63
S.R.18: C. I. Solvent Red 18
STR: styrene
TCDM: methacrylic acid tricyclo[$5.2.1.0^{2,6}$]decan-8-yl; dimethylol-tricyclodecane dimethacrylate
TFEMA: (2,2,2-trifluoro)ethyl methacrylate
TFMB: 2,2'-bis(trifluoromethyl)-4,4'-diaminobiphenyl
TFPrTMS: 3,3,3-trifluoropropyltrimethoxysilane
THF: tetrahydrofuran
TMOS: tetramethoxysilane
TMSSucA: 3-trimethoxysilylpropylsuccinic anhydride
TPK-1227: carbon black of which the surface is treated so as to introduce a sulfonic acid group thereto (manufactured by CABOT Corporation)
TrisP-PA: 1,1-bis(4-hydroxyphenyl)-1-[4-[1-(4-hydroxyphenyl)-1-methyl ethyl]phenyl]ethane (manufactured by Honshu Kagaku Industry Co., Ltd.)

DESCRIPTION OF REFERENCE SIGNS

1: TFT
2: Wiring line
3: TFT insulating layer
4: Planarization layer
5: ITO
6: Substrate
7: Contact hole
8: Insulating layer
9: Glass substrate
10: First electrode
11: Auxiliary electrode
12: Insulating layer
13: Organic EL layer
14: Second electrode

The invention claimed is:
1. A method for manufacturing an organic EL display device, said method comprising:
  emitting an actinic ray onto a photosensitive resin film through a mask having a pattern, and
  a bleaching treatment that is included in an insulating layer formation step,
  wherein the organic EL display device in which the insulating layer formed on a first electrode comprises a cured film produced by curing a photosensitive resin composition, wherein the below-shown index (a), which indicates the residual amount of acid anhydrides in the cured film, is 0.003 to 0.04 inclusive:

index $(a)$=(intensity at 1853 $cm^{-1}$)/(intensity at 1436 $cm^{-1}$)

wherein each of the intensities represents an intensity of absorption measured with a Fourier transform infrared spectrometer (FT-IR),
  wherein the photosensitive resin composition comprises (A) an alkali-soluble resin having a carboxylic acid structure, (B) a photosensitizing agent, and (C) an organic solvent,
  wherein the photosensitizing agent (B) is (b1) an o-quinone diazide compound and has positive-type photosensitivity, and
  wherein the bleaching treatment is carried out on a pattern on the photosensitive resin film.
2. The method for manufacturing the organic EL display device according to claim 1, wherein the alkali-soluble resin having a carboxylic acid structure (A) is an alkali-soluble resin having an aromatic carboxylic acid structure.
3. The method for manufacturing the organic EL display device according to claim 1, wherein the alkali-soluble resin having a carboxylic acid structure (A) contained in the photosensitive resin composition is a polyimide precursor.
4. The method for manufacturing the organic EL display device according to claim 1, wherein the alkali-soluble resin having a carboxylic acid structure (A) contained in the photosensitive resin composition is a polyimide precursor having an amic acid structure.

5. The method for manufacturing the organic EL display device according to claim 1, wherein the alkali-soluble resin having a carboxylic acid structure (A) contained in the photosensitive resin composition has a structure represented by general formula (1):

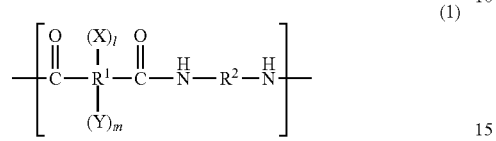

wherein $R^1$ represents a tetravalent organic group containing an aromatic ring; $R^2$ represents a bivalent to tetravalent organic group containing an aromatic ring; X represents a carboxylic acid which is covalently bonded to an aromatic ring; Y represents a carboxylic acid ester which is covalently bonded to an aromatic ring; and l represents an integer of 1 to 2 and m represents an integer of 0 to 1, wherein l+m is 2.

6. The method for manufacturing the organic EL display device according to claim 1, wherein the photosensitive resin composition contains (F) a coloring material.

7. The method for manufacturing the organic EL display device according to claim 1, wherein an insulating layer opening ratio in a display area is 20% or less.

8. The method for manufacturing the organic EL display device according to claim 2, wherein the alkali-soluble resin having a carboxylic acid structure (A) contained in the photosensitive resin composition is a polyimide precursor.

9. The method for manufacturing the organic EL display device according to claim 2, wherein the alkali-soluble resin having a carboxylic acid structure (A) contained in the photosensitive resin composition is a polyimide precursor having an amic acid structure.

10. The method for manufacturing the organic EL display device according to claim 3, wherein the alkali-soluble resin having a carboxylic acid structure (A) contained in the photosensitive resin composition is a polyimide precursor having an amic acid structure.

11. The method for manufacturing the organic EL display device according to claim 2, wherein the alkali-soluble resin having a carboxylic acid structure (A) contained in the photosensitive resin composition has a structure represented by general formula (1):

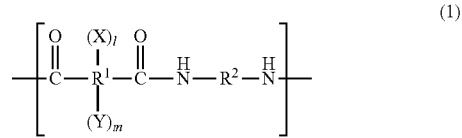

wherein $R^1$ represents a tetravalent organic group containing an aromatic ring; $R^2$ represents a bivalent to tetravalent organic group containing an aromatic ring; X represents a carboxylic acid which is covalently bonded to an aromatic ring; Y represents a carboxylic acid ester which is covalently bonded to an aromatic ring; and l represents an integer of 1 to 2 and m represents an integer of 0 to 1, wherein l+m is 2.

12. The method for manufacturing the organic EL display device according to claim 3, wherein the alkali-soluble resin having a carboxylic acid structure (A) contained in the photosensitive resin composition has a structure represented by general formula (1):

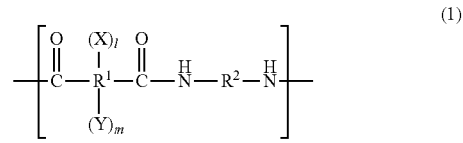

wherein $R^1$ represents a tetravalent organic group containing an aromatic ring; $R^2$ represents a bivalent to tetravalent organic group containing an aromatic ring; X represents a carboxylic acid which is covalently bonded to an aromatic ring; Y represents a carboxylic acid ester which is covalently bonded to an aromatic ring; and l represents an integer of 1 to 2 and m represents an integer of 0 to 1, wherein l+m is 2.

13. The method for manufacturing the organic EL display device according to claim 4, wherein the alkali-soluble resin having a carboxylic acid structure (A) contained in the photosensitive resin composition has a structure represented by general formula (1):

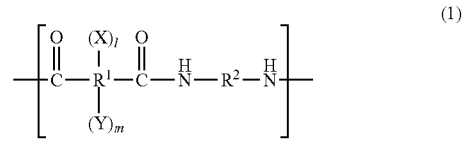

wherein $R^1$ represents a tetravalent organic group containing an aromatic ring; $R^2$ represents, a bivalent to tetravalent organic group containing an aromatic ring; X represents a carboxylic acid which is covalently bonded to an aromatic ring; Y represents a carboxylic acid ester which is covalently bonded to an aromatic ring; and l represents an integer of 1 to 2 and m represents an integer of 0 to 1, wherein l+m is 2.

* * * * *